(12) United States Patent
Yasu et al.

(10) Patent No.: US 10,748,952 B2
(45) Date of Patent: Aug. 18, 2020

(54) SENSOR CHIP AND ELECTRONIC APPARATUS

(71) Applicant: Sony Semiconductor Solutions Corporation, Kanagawa (JP)

(72) Inventors: Yohtaro Yasu, Kanagawa (JP); Katsuhiko Hanzawa, San Jose, CA (US)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/448,720

(22) Filed: Jun. 21, 2019

(65) Prior Publication Data

US 2019/0312077 A1    Oct. 10, 2019

Related U.S. Application Data

(63) Continuation of application No. 15/695,400, filed on Sep. 5, 2017, now Pat. No. 10,418,405.

(51) Int. Cl.
| | |
|---|---|
| *H01L 27/146* | (2006.01) |
| *H04N 5/378* | (2011.01) |
| *G01S 7/4863* | (2020.01) |
| *H04N 5/376* | (2011.01) |
| *H04N 5/353* | (2011.01) |

(52) U.S. Cl.
CPC ...... *H01L 27/14634* (2013.01); *G01S 7/4863* (2013.01); *H01L 27/14636* (2013.01); *H04N 5/353* (2013.01); *H04N 5/378* (2013.01); *H04N 5/3765* (2013.01)

(58) Field of Classification Search
None
See application file for complete search history.

(56) References Cited

U.S. PATENT DOCUMENTS

| | | | |
|---|---|---|---|
| 2002/0101528 A1 | 8/2002 | Lee et al. | |
| 2006/0001918 A1* | 1/2006 | Okano | H04N 5/3653 358/482 |

(Continued)

FOREIGN PATENT DOCUMENTS

| | | |
|---|---|---|
| JP | 2005-354567 A | 12/2005 |
| JP | 2009-177207 A | 8/2009 |

(Continued)

OTHER PUBLICATIONS

International Search Report dated Nov. 13, 2018 for corresponding International Application No. PCT/JP2018/030905.

(Continued)

*Primary Examiner* — Thien F Tran
(74) *Attorney, Agent, or Firm* — Michael Best & Friedrich LLP

(57) ABSTRACT

A time of flight sensor is disclosed. In one example, it includes a pixel array with pixels arranged in rows and columns. A global control circuit disposed along a first side of the pixel array outputs a global control signal to the pixels. The global control circuit has a clock tree structure that includes buffer circuits and driving circuits. A rolling control circuit disposed along a second side of the pixel array outputs a rolling control signal to the pixels. A column circuit with analog-to-digital converters is coupled to the pixels.

30 Claims, 32 Drawing Sheets

(56) References Cited

U.S. PATENT DOCUMENTS

| | | | |
|---|---|---|---|
| 2009/0273696 A1* | 11/2009 | Krymski | H04N 5/378 |
| | | | 348/302 |
| 2016/0211299 A1 | 7/2016 | Arita | |
| 2016/0248999 A1 | 8/2016 | Ueda et al. | |
| 2016/0300525 A1 | 10/2016 | Segura Puchades | |
| 2019/0383917 A1* | 12/2019 | Shinozuka | G01S 17/08 |

FOREIGN PATENT DOCUMENTS

| | | |
|---|---|---|
| JP | 2012-049547 A | 3/2012 |
| JP | 2014-030170 A | 2/2014 |
| JP | 2015-106924 A | 6/2015 |
| JP | 2016-171375 A | 9/2016 |
| JP | 2017-188879 A | 10/2017 |
| WO | WO-03/041174 A1 | 5/2003 |
| WO | WO-2015/119243 A1 | 8/2015 |
| WO | 2016/170833 A1 | 10/2016 |

OTHER PUBLICATIONS

Extended European Search Report dated Feb. 25, 2020 for related European Application No. 18853942.3.

\* cited by examiner

SENSOR CHIP AND ELECTRONIC APPARATUS

CROSS REFERENCE TO RELATED APPLICATIONS

The present application is a Continuation application of U.S. patent application Ser. No. 15/695,400 filed Sep. 5, 2017, the entire contents of which are incorporated herein by reference.

TECHNICAL FIELD

The present disclosure relates to a sensor chip and an electronic apparatus, and more particularly, to a sensor chip and an electronic apparatus capable of performing control at a higher speed.

BACKGROUND ART

Recently, sensor chips of a complementary metal oxide semiconductor (CMOS) image sensor, a time of flight (ToF) sensor, a fluorescence emission detection sensor, and the like are requested to perform control at a high speed. For example, in a sensor chip that is requested to perform high-speed driving exceeding a frame rate of 1 Mfps, it is necessary to control a pulse of a control signal in order of sub μ seconds or 10 n seconds. For example, in PTL 1, a ToF sensor capable of immediately performing signal processing for tracing an object measured in a three-dimensional image and the like by randomly outputting measured information is disclosed.

CITATION LIST

Patent Literature

[PTL 1]
JP 2012-049547A

SUMMARY

Technical Problem

However, in a case where a driving element driving a sensor element included in a sensor chip as described above is arranged to be away from the sensor element, it is difficult to perform high-speed control due to the influences of a delay of a control signal used for driving the sensor element, a slew rate, and the like. The present disclosure is made in consideration of the state, and is capable of performing control at a high speed.

Solution to Problem

A sensor chip of one aspect of the present disclosure includes: pixel array unit that has a rectangular-shaped area in which a plurality of sensor elements are arranged in an array pattern; and global control circuit, in which driving elements simultaneously driving the sensor elements are arranged in one direction, and each of the driving elements is connected to a control line disposed for each one column of the sensor elements, that is arranged to have a longitudinal direction to be along a long side of the pixel array unit.

An electronic apparatus of one aspect of the present disclosure including a sensor chip including: a pixel array unit that has a rectangular-shaped area in which a plurality of sensor elements are arranged in an array pattern; and a global control circuit, in which driving elements simultaneously driving the sensor elements are arranged in one direction, and each of the driving elements is connected to a control line disposed for each one column of the sensor elements, that is arranged to have a longitudinal direction to be along a long side of the pixel array unit.

According to one aspect of the present disclosure, a pixel array unit is an area having a rectangular shape in which a plurality of sensor elements are arranged in an array pattern, and, in a global control circuit, driving elements simultaneously driving the sensor elements are arranged in one direction, the longitudinal direction thereof is arranged along a long side of the pixel array unit, and each of the driving elements is connected to a control line disposed for each one column of the sensor elements.

Advantageous Effects of Invention

According to one aspect of the present disclosure, higher-speed control can be performed.

Note that the effects described here are not necessarily limited, but any one of effects described in the present disclosure may be acquired.

DESCRIPTION OF EMBODIMENTS

Hereinafter, specific embodiments of the present technology will be described in detail with reference to the drawings.

<First Configuration Example of Sensor Chip>

Figure 1:
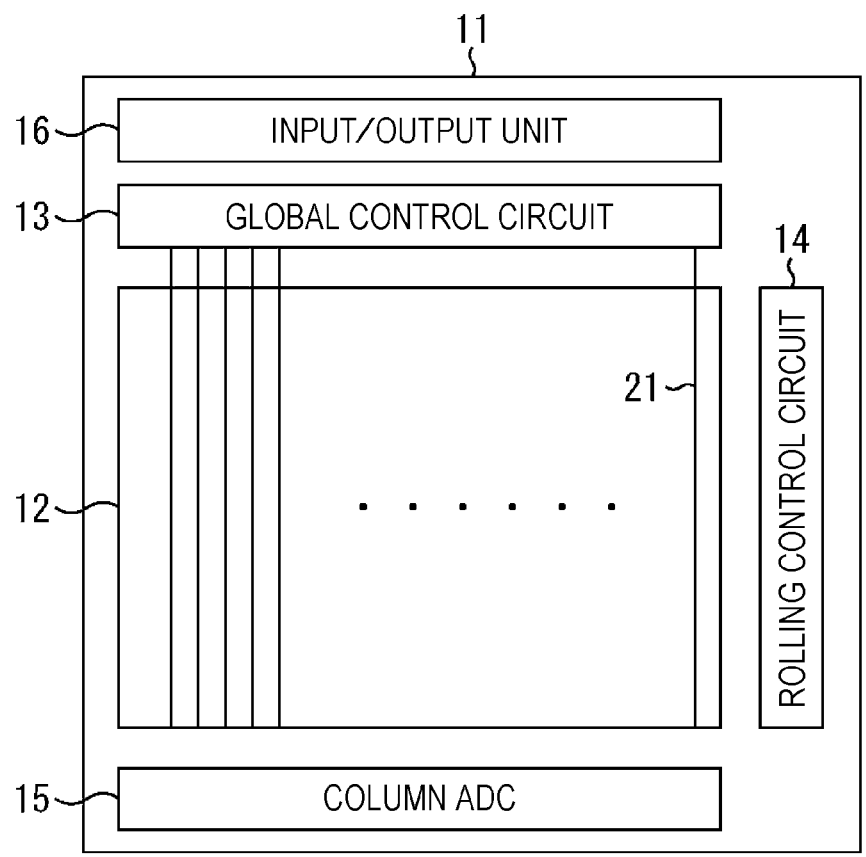
FIG. 1 is a block diagram that illustrates an example of the configuration of a sensor chip according to a first embodiment of the present technology.

FIG. 1 is a block diagram that illustrates an example of the configuration of a sensor chip according to a first embodiment of the present technology.

As illustrated in FIG. 1, the sensor chip 11 has a configuration in which a pixel array unit 12, a global control circuit 13, a rolling control circuit 14, a column analog-to-digital converter (ADC) 15, and an input/output unit 16 are arranged on a semiconductor substrate.

The pixel array unit 12 is a rectangular-shaped area in which various sensor elements according to the function of the sensor chip 11, for example, photoelectric conversion elements performing photoelectric conversion of light are arranged in an array pattern. In the example illustrated in FIG. 1, the pixel array unit 12 is a horizontally-long rectangular area having a long side disposed in the horizontal direction and a short side disposed in the vertical direction.

The global control circuit 13 is a control circuit that outputs global control signals used for controlling a plurality of sensor elements arranged in the pixel array unit 12 to be driven together (simultaneously) at approximately the same timing. In the configuration example illustrated in FIG. 1, the global control circuit 13 is arranged on the upper side of the pixel array unit 12 such that the longitudinal direction thereof is along the long side of the pixel array unit 12. Thus, in the sensor chip 11, control lines 21 supplying global control signals output from the global control circuit 13 to the sensor elements of the pixel array unit 12 are arranged in the vertical direction of the pixel array unit 12 for each column of sensor elements arranged in the pixel array unit 12 in a matrix pattern.

The rolling control circuit 14 is a control circuit that outputs rolling control signals used for performing control such that a plurality of sensor elements arranged in the pixel array unit 12 are sequentially (successively) driven for each row. In the configuration example illustrated in FIG. 1, the rolling control circuit 14 is arranged on the right side of the pixel array unit 12 such that the longitudinal direction thereof is along the short side of the pixel array unit 12.

The column ADC 15 performs analog-to-digital (AD) conversion of analog sensor signals output from the sensor elements of the pixel array unit 12 into digital values in parallel for each column. At this time, the column ADC 15, for example, can remove reset noises included in the sensor signals by performing a correlated double sampling (CDS) process for the sensor signals.

In the input/output unit 16, terminals used for performing input/output between the sensor chip 11 and an external circuit are disposed, and, for example, power that is necessary for driving the global control circuit 13 is input to the sensor chip 11 through the input/output unit 16. In the configuration example illustrated in FIG. 1, the input/output unit 16 is arranged along the global control circuit 13 to be adjacent to the global control circuit 13. For example, the global control circuit 13 has high power consumption, and thus, in order to decrease the influence of an IR drop (voltage drop), it is preferable to arrange the input/output unit 16 near the global control circuit 13. The sensor chip 11 is configured as such, and a layout in which the global control circuit 13 is arranged to be along the long side of the pixel array unit 12 is employed. Accordingly, in the sensor chip 11, a distance from the global control circuit 13 to sensor elements arranged at a far end (the lower end in the example illustrated in FIG. 1) of the control line 21 can be configured to be shorter than the layout in which the global control circuit 13 is arranged to be along the short side of the pixel array unit 12.

Accordingly, the sensor chip 11 can improve the amount of delay occurring in a global control signal output from the global control circuit 13 and a slew rate, and accordingly, the sensor elements can be controlled at a higher speed. Particularly, in a case where the sensor chip 11 is an image sensor driving a global shutter, a transmission signal, a reset signal, an overflow gate signal, and the like supplied to pixels can be controlled at a high speed. On the other hand, in a case where the sensor chip 11 is a ToF sensor, a MIX signal can be controlled at a higher speed.

For example, in a ToF sensor, a fluorescence emission detection sensor, or the like, in a case where a slew rate of a global control signal, the amount of delay of a global control signal occurring according to a distance from a driving element, or the like is different for each sensor element, there is a detection error. In contrast to this, since the sensor chip 11 can improve the amount of delay occurring in the global control signal and the slew rate, such a detection error can be suppressed.

In addition, in a case where the sensor chip 11 is the ToF sensor, the fluorescence emission detection sensor, or the like, a plurality of times of On/Off control exceeding 100 times is necessary in an exposure period, and a consumed current becomes large due to a high toggle frequency. In contrast to this, in the sensor chip 11, as described above, the input/output unit 16 is arranged near the global control circuit 13, and a power source can be configured as an independent wiring.

In addition, in the sensor chip 11, in an exposure period, while the global control circuit 13 frequently operates, the rolling control circuit 14 is stopped. On the other hand, in the sensor chip 11, in a reading period, while the rolling control circuit 14 operates, the global control circuit 13 frequently stops. For this reason, in the sensor chip 11, it is requested to independently control the global control circuit 13 and the rolling control circuit 14. In addition, for the sensor chip 11, in order to secure in-plane simultaneity, generally, a clock tree structure as illustrated in FIG. 2C to be described later is employed in the global control circuit 13, and thus, it is preferable that the global control circuit 13 is arranged independently from the rolling control circuit 14.

Accordingly, as in the case of the sensor chip 11, in a case where it is requested to perform control at a higher speed, by employing a layout in which the global control circuit 13 and the rolling control circuit 14 are individually arranged independently, a more improved control process can be performed. In addition, as long as the global control circuit 13 and the rolling control circuit 14 are individually arranged independently, any one of a layout in which the circuits are arranged along a same direction and a layout in which the circuits are arranged to be orthogonal to each other may be employed. Note that, in this embodiment, while the upper side in the drawing will be described as the upper side of the pixel array unit 12, and the lower side in the drawing will be described as the lower side of the pixel array unit 12 in accordance with the configuration example illustrated in the drawing, for example, as long as the global control circuit 13 is arranged along the long side of the pixel array unit 12, even in a case where the global control circuit 13 is arranged on any one of the upper side and the lower side of the pixel array unit 12, similar operations and effects can be acquired. In addition, this similarly applies also to the pixel array unit 12 and the column ADC 15.

The configuration of the global control circuit 13 will be described with reference to FIGS. 2A to 2C.

Figure 2A:
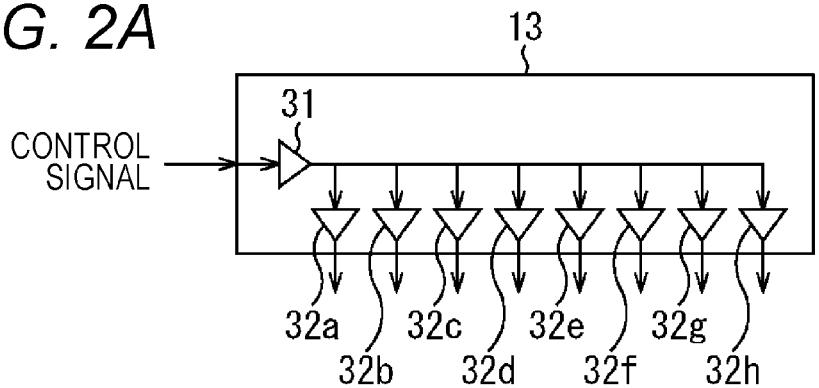
FIGS. 2A to 2C are diagrams that illustrate examples of the configuration of a global control circuit.
Figure 2B:
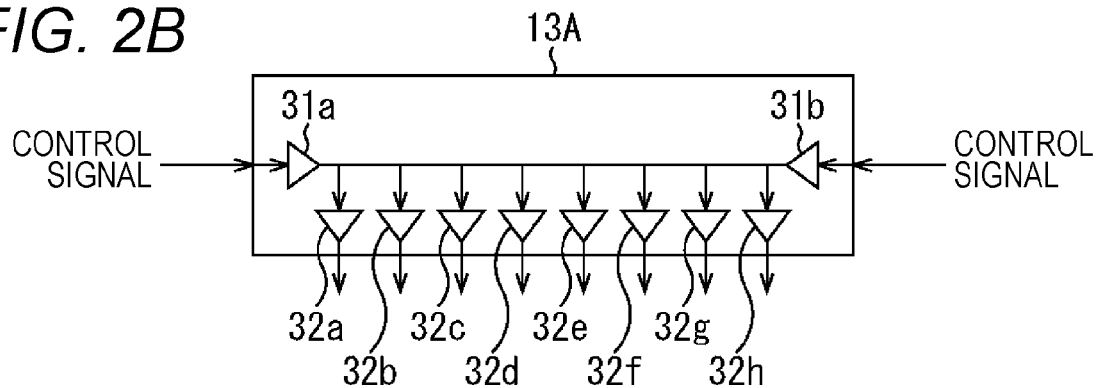
Figure 2C:
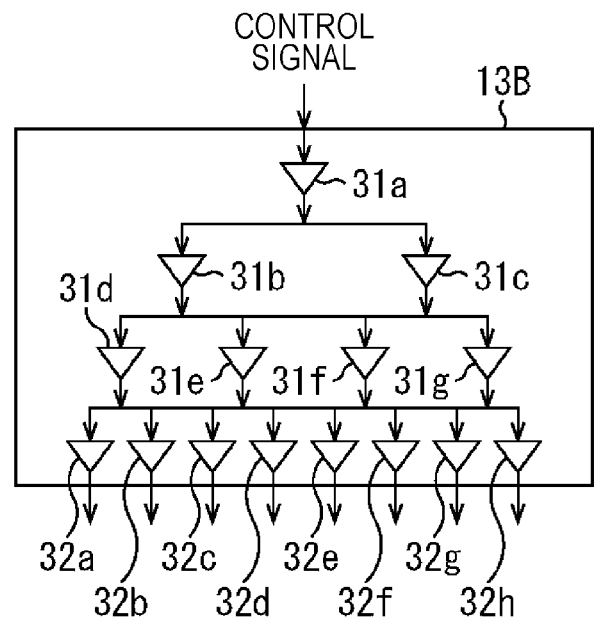

FIG. 2A illustrates a first configuration example of the global control circuit 13, FIG. 2B illustrates a second configuration example of the global control circuit 13, and FIG. 2C illustrates a third configuration example of the global control circuit 13. Note that, while the global control circuit 13 is configured to simultaneously output global control signals corresponding to the number of columns of sensor elements arranged in the pixel array unit 12, a configuration for simultaneously outputting eight global control signals is schematically illustrated in FIGS. 2A to 2C as a part thereof.

A global control circuit 13 illustrated in FIG. 2A is configured to include one internal buffer 31 and eight driving elements 32a to 32h.

As illustrated in the drawing, the global control circuit 13 has a connection configuration in which the internal buffer 31 is connected to one end of an internal wiring disposed along the longitudinal direction, and the driving elements 32a to 32h are connected to the internal wiring in one direction in accordance with the positions of control lines 21 illustrated in FIG. 1. Accordingly, a global control signal input to the global control circuit 13 is supplied from one end side (the left side in the example illustrated in FIGS. 2A to 2C) of the internal wiring to the driving elements 32a to 32h through the internal buffer 31 and is simultaneously output to the control lines 21 respectively connected thereto.

A global control circuit 13A illustrated in FIG. 2B is configured to include two internal buffers 31a and 31b and eight driving elements 32a to 32h.

As illustrated in the drawing, the global control circuit 13A has a connection configuration in which the internal buffers 31a and 31b are connected to both ends of an internal wiring disposed along the longitudinal direction of the global control circuit 13A, and the driving elements 32a to 32h are connected to the internal wiring in one direction in accordance with the positions of the control lines 21 illustrated in FIG. 1. Thus, a global control signal input to the global control circuit 13A is supplied to the driving elements 32a to 32h from both the ends of the internal wirings through the internal buffers 31a and 31b, and the supplied global control signals are simultaneously output to the control lines 21 connected thereto.

A global control circuit 13B illustrated in FIG. 2C is configured to include seven internal buffers 31a to 31g and eight driving elements 32a to 32h.

As illustrated in the drawing, the global control circuit 13B has a connection configuration in which a clock tree structure is configured by the internal buffers 31a to 31g and is connected to the driving elements 32a to 32h arranged in one direction in accordance with the positions of control lines 21 in the final stage. For example, the clock tree structure is a structure in which a configuration in which the output of one internal buffer 31 is input to two internal buffers 31 in the first stage, and the outputs of the two internal buffers 31 are input to four internal buffers 31 in the second stage is repeated in a plurality of stages. Thus, a global control signal input to the global control circuit 13B is supplied to the driving elements 32a to 32h through the clock tree structure formed by the internal buffers 31a to 31g, and the supplied global control signals are simultaneously output to control lines 21 connected thereto.

According to the global control circuit 13B having such a configuration, the occurrence of delays among the driving elements 32a to 32h can be avoided, and, for example, compared to the global control circuits 13 and 13A, in-plane uniformity can be secured. In other words, it is appropriate to employ the global control circuit 13B for a use strongly requesting simultaneity over a direction in which the driving elements 32 are aligned.

The configuration of the rolling control circuit 14 will be described with reference to FIGS. 3A and 3B.

Figure 3A:
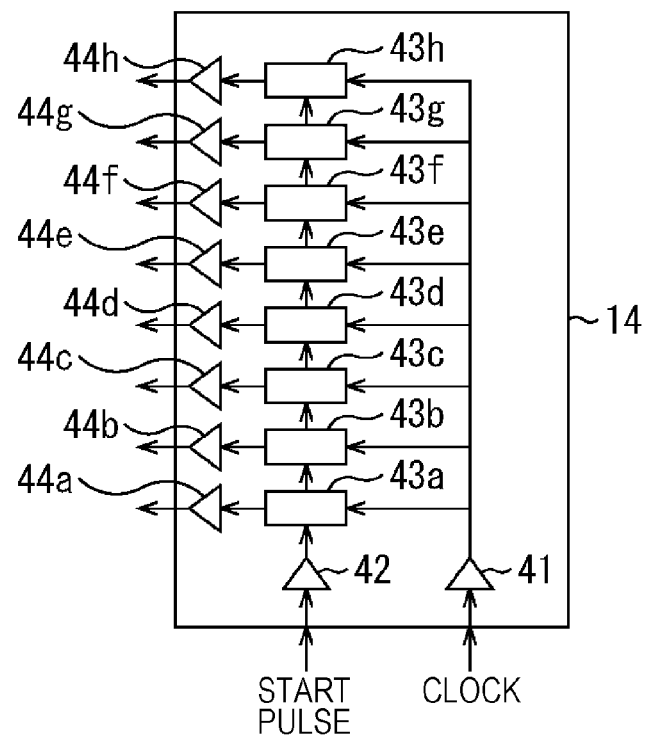
FIGS. 3A and 3B are diagrams that illustrate examples of the configuration of a rolling control circuit.
Figure 3B:
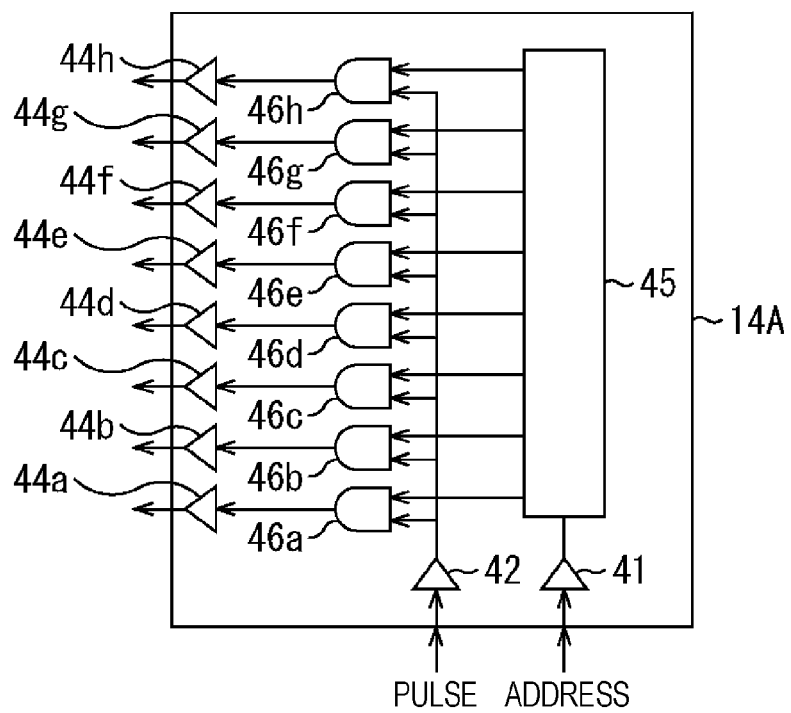

FIG. 3A illustrates a first configuration example of the rolling control circuit 14, and FIG. 3B illustrates a second configuration example of the rolling control circuit 14. Note that, while the rolling control circuit 14 is configured to sequentially output rolling control signals corresponding to the number of rows of sensor elements arranged in the pixel array unit 12, a configuration in which eight rolling control signals are sequentially output is schematically illustrated as a part thereof in FIGS. 3A and 3B.

The rolling control circuit 14 illustrated in FIG. 3A employs a shift register system and is configured to include two internal buffers 41 and 42, eight registers 43a to 43h, and eight driving elements 44a to 44h. Note that, for the simplification, while a configuration example in which the two internal buffers 41 and 42 are arranged is illustrated, a configuration in which a plurality of internal buffers are arranged according to the wiring lengths of the internal buffers and the like may be employed.

As illustrated in the drawing, the rolling control circuit 14 has a connection configuration in which the internal buffer 41 is connected to one end of an internal wiring disposed along the longitudinal direction, and the registers 43a to 43h are connected to the internal wiring in accordance with the positions of rows of sensor elements arranged in the pixel array unit 12. In addition, the rolling control circuit 14 has a connection configuration in which the internal buffer 42 is connected to the register 43a, the registers 43a to 43h are sequentially connected together, and the driving elements 44a to 44h are respectively connected to the registers 43a to 43h.

Accordingly, in the rolling control circuit 14, a start pulse supplied to the register 43a through the internal buffer 42 is sequentially shifted to the registers 43a to 43h in accordance with a clock signal supplied through the internal buffer 41, and the start pulses are sequentially output from the driving elements 44a to 44h respectively connected to the registers 43a to 43h as rolling control signals.

The rolling control circuit 14A illustrated in FIG. 3B employs a decoder system and is configured to include two internal buffers 41 and 42, a decoder 45, eight AND gates 46a to 46h, and eight driving elements 44a to 44h. Note that the decoder 45 may use any one of a system including a latch and a system not including a latch. For example, the decoder 45 may employ a system in which an address is transmitted at once, a system in which an address is divided and transmitted, or the like as a system for latching a signal.

As illustrated in the drawing, in the rolling control circuit 14A, the internal buffer 41 is connected to the decoder 45, the internal buffer 42 is connected to input terminals of the AND gates 46a to 46h, and the decoder 45 is connected to the input terminals of the AND gates 46a to 46h for each row. Furthermore, the rolling control circuit 14A has a connection configuration in which output terminals of the AND gates 46a to 46h are connected to the driving elements 44a to 44h. Accordingly, in the rolling control circuit 14A, pulses supplied to the AND gates 46a to 46h through the internal buffer 42 are sequentially output from the driving elements 44a to 44h of a row designated according to an address supplied to the decoder 45 through the internal buffer 41 as rolling control signals.

As described with reference to FIGS. 2A to 3B, the global control circuit 13 and the rolling control circuit 14 have mutually-different circuit configurations.

Figure 4:
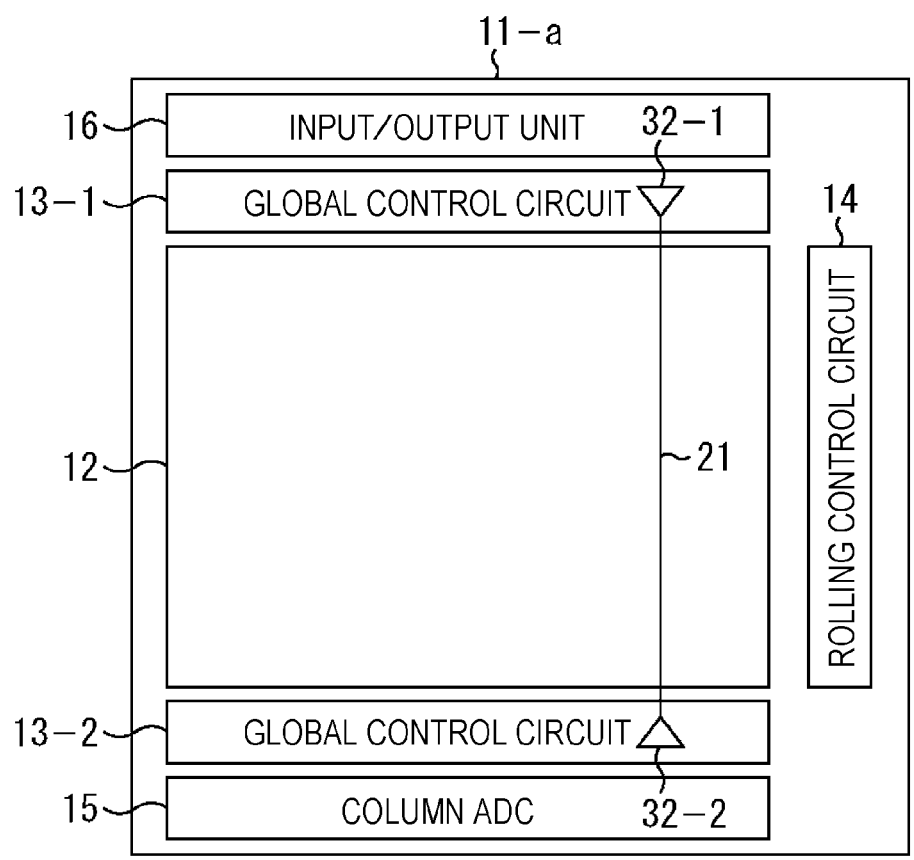
FIG. 4 is a block diagram that illustrates a first modified example of the sensor chip illustrated in FIG. 1.

FIG. 4 is a block diagram that illustrates a first modified example of the sensor chip 11 illustrated in FIG. 1. Note that a same reference numeral will be assigned to a configuration common to the sensor chip 11 illustrated in FIG. 1 among blocks configuring a sensor chip 11-a illustrated in FIG. 4, and detailed description thereof will not be presented.

In other words, as illustrated in FIG. 4, in the sensor chip 11-a, the arrangement of a pixel array unit 12, a rolling control circuit 14, a column ADC 15, and an input/output unit 16 is common to the sensor chip 11 illustrated in FIG. 1.

On the other hand, in the sensor chip 11-a, two global control circuits 13-1 and 13-2 are arranged along the upper side and the lower side of the pixel array unit 12, and driving elements 32-1 and 32-2 are connected to both ends of a control line 21, which is different from the configuration of the sensor chip 11 illustrated in FIG. 1. In other words, the sensor chip 11-a is configured such that the driving element 32-1 included in the global control circuit 13-1 supplies a global control signal from the upper end of the control line 21, and the driving element 32-2 included in the global control circuit 13-2 supplies a global control signal from the lower end of the control line 21.

The sensor chip 11-a configured in this way can suppress a skew between the two driving element 32-1 and the driving element 32-2, and accordingly, variations in delay times occurring in global control signals propagating through the control line 21 can be eliminated. Accordingly, the sensor chip 11-a can perform control for sensor elements at a higher speed. In addition, it is necessary for the sensor chip 11-a to perform control such that an increase in the delay difference between outputs of global control signals is avoided to prevent the generation of a through current.

Figure 5:
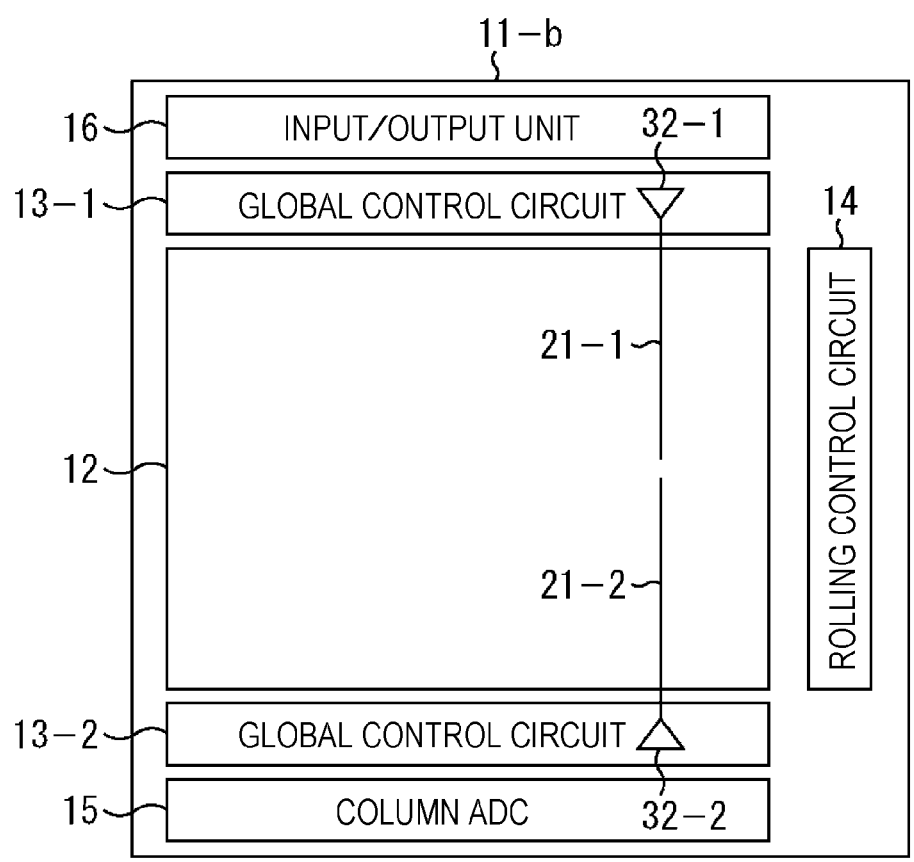
FIG. 5 is a block diagram that illustrates a second modified example of the sensor chip illustrated in FIG. 1.

FIG. 5 is a block diagram that illustrates a second modified example of the sensor chip 11 illustrated in FIG. 1. Note that a same reference numeral will be assigned to a configuration common to the sensor chip 11 illustrated in FIG. 1 among blocks configuring a sensor chip 11-b illustrated in FIG. 5, and detailed description thereof will not be presented.

In other words, as illustrated in FIG. 5, in the sensor chip 11-b, the arrangement of a pixel array unit 12, a rolling control circuit 14, a column ADC 15, and an input/output unit 16 is common to the sensor chip 11 illustrated in FIG. 1.

On the other hand, in the sensor chip 11-b, two global control circuits 13-1 and 13-2 are arranged along the upper side and the lower side of the pixel array unit 12, and two control lines 21-1 and 21-2 are arranged to be separate at the center of the column of sensor elements arranged in a matrix pattern in the pixel array unit 12, which is different from the configuration of the sensor chip 11 illustrated in FIG. 1. Furthermore, in the sensor chip 11-b, a driving element 32-1 is connected to the upper end of the control line 21-1, and a driving element 32-2 is connected to the lower end of the control line 21-2.

Accordingly, the sensor chip 11-b is configured such that the driving element 32-1 included in the global control circuit 13-1 supplies a global control signal from the upper end of the control line 21-1 to sensor elements arranged on the upper side from the center of the pixel array unit 12. In addition, the sensor chip 11-b is configured such that the driving element 32-2 included in the global control circuit 13-2 supplies a global control signal from the lower end of the control line 21-2 to a sensor element arranged on a further lower side than the center of the pixel array unit 12.

In the sensor chip 11-b configured in this way, a distance from the driving element 32-1 to a sensor element arranged at a far end (the lower end in the example illustrated in FIG. 5) of the control line 21-1 and a distance from the driving element 32-2 to a sensor element arranged at a far end (the upper end in the example illustrated in FIG. 5) of the control line 21-2 can be configured to be shorter than those of the sensor chip 11 illustrated in FIG. 1. In this way, the sensor chip 11-b can further decrease the amount of delay occurring in global control signals output from the global control circuits 13-1 and 13-2 and the slew rate thereof, and accordingly, the control for sensor elements can be performed at a higher speed.

<Second Configuration Example of Sensor Chip>

A sensor chip according to a second embodiment of the present technology will be described with reference to FIG. 6. Note that a same reference numeral will be assigned to a configuration common to the sensor chip 11 illustrated in FIG. 1 among blocks configuring a sensor chip 11A illustrated in FIG. 6, and detailed description thereof will not be presented.

Figure 6:
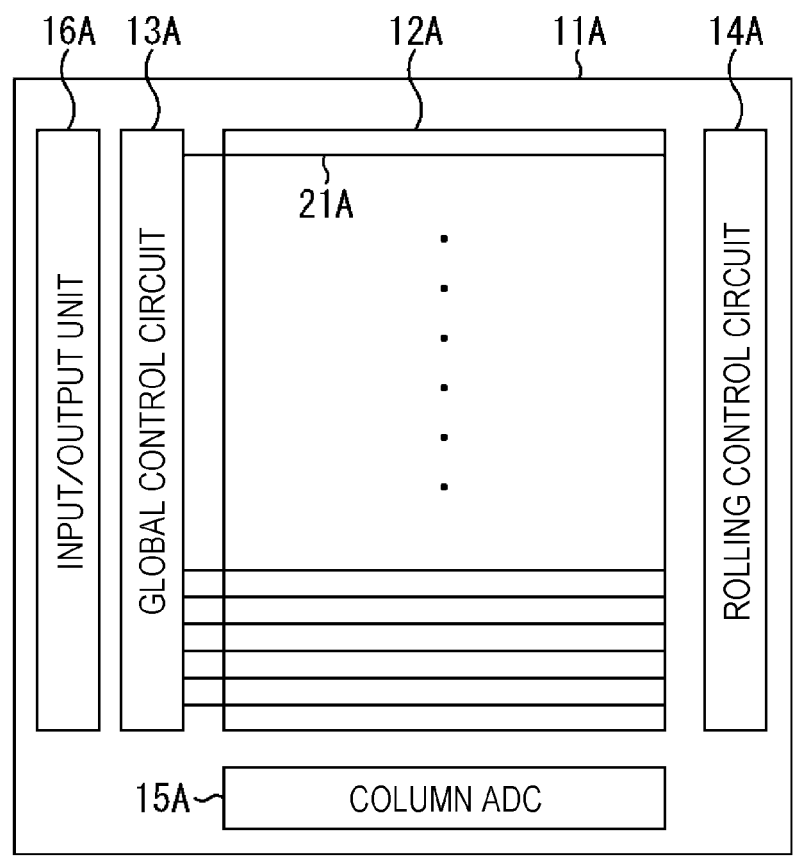
FIG. 6 is a block diagram that illustrates an example of the configuration of a sensor chip according to a second embodiment.

As illustrated in FIG. 6, the sensor chip 11A has a configuration in which a pixel array unit 12A, a global control circuit 13A, a rolling control circuit 14A, a column ADC 15A, and an input/output unit 16A are arranged on a semiconductor substrate.

Furthermore, in the sensor chip 11A, the pixel array unit 12A is a vertically-long rectangular area in which a long side is disposed in the vertical direction, and a short side is disposed in the horizontal direction, which is different from the configuration of the sensor chip 11 illustrated in FIG. 1. Thus, in the sensor chip 11A, the global control circuit 13A and the input/output unit 16A are arranged on the left side of the pixel array unit 12A along the long side of the pixel array unit 12A. In accompaniment with this, a control line 21A is arranged in the horizontal direction of the pixel array unit 12A for each row of sensor elements arranged in the pixel array unit 12A in a matrix pattern.

In addition, in the sensor chip 11A, the rolling control circuit 14A is arranged on the right side (a side facing the global control circuit 13A) of the pixel array unit 12A along the long side of the pixel array unit 12A. Note that, although the global control circuit 13A and the pixel array unit 12A may be arranged on the same side with respect to the pixel array unit 12A, in such a case, the wiring length of one side is assumed to be increased, and thus, the arrangement as illustrated in the drawing is preferable.

In addition, in the sensor chip 11A, the column ADC 15A is arranged on the lower side of the pixel array unit 12A along the short side of the pixel array unit 12A. In this way, the reason for arranging the column ADC 15A in a direction orthogonal to the rolling control circuit 14A is for a need for the column ADC 15A to turn on one sensor element connected to one AD converter each time, and a layout in which wirings overlap each other is avoided.

In the sensor chip 11A configured in this way, similar to the sensor chip 11 illustrated in FIG. 1, by employing a layout in which the global control circuit 13A is arranged along the long side of the pixel array unit 12A, the wiring length of the control line 21A can be configured to be short. Accordingly, the sensor chip 11A, similar to the sensor chip 11 illustrated in FIG. 1, can perform control for sensor elements at a higher speed.

<Third Configuration Example of Sensor Chip>

Figure 7:
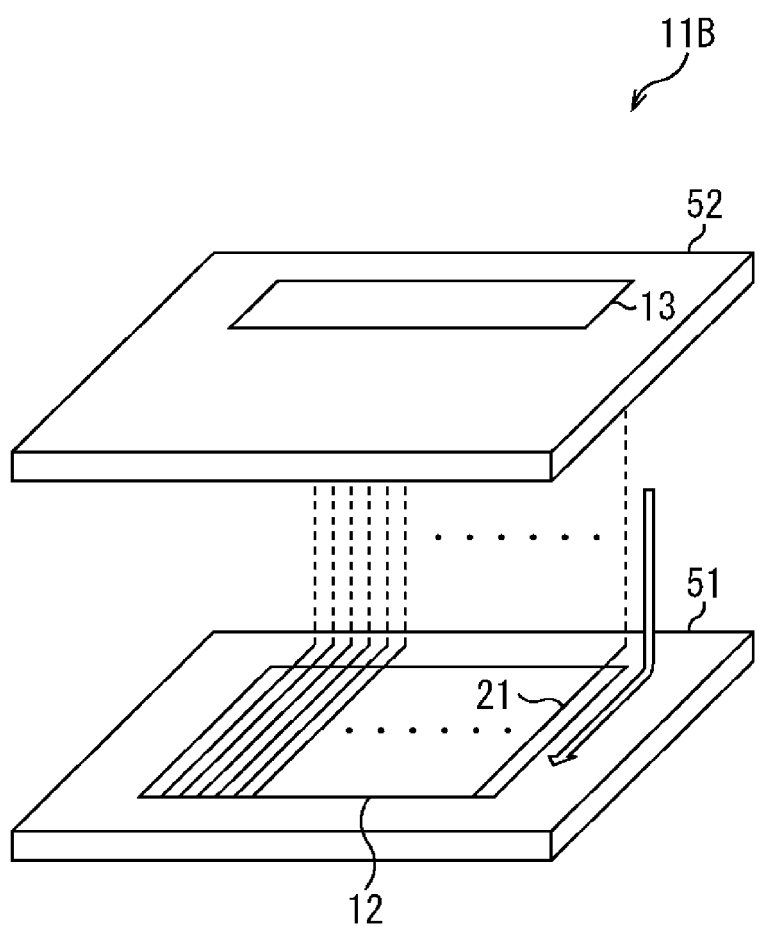
FIG. 7 is a perspective view that illustrates an example of the configuration of a sensor chip according to a third embodiment.
Figure 8:
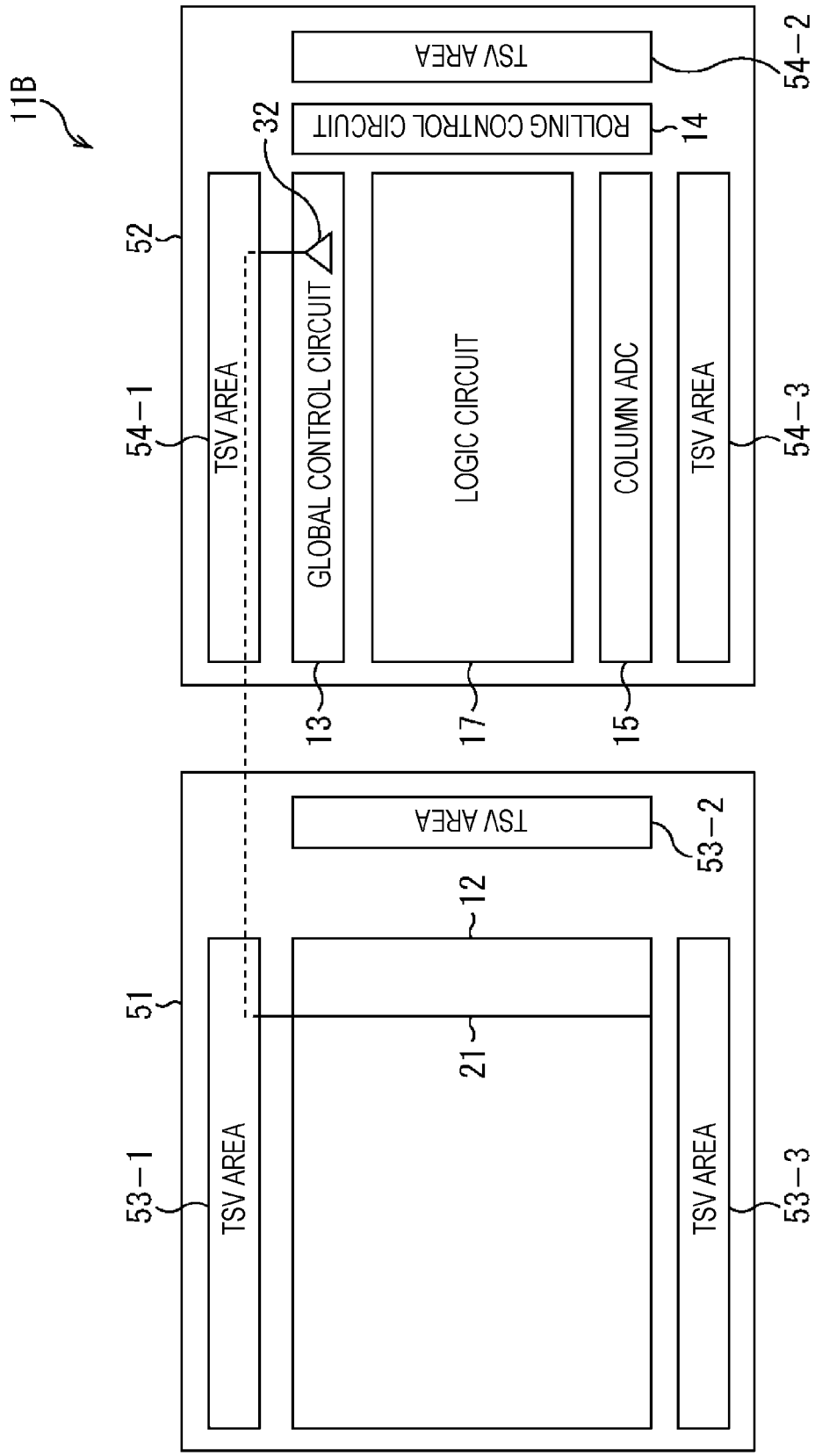
FIG. 8 is a block diagram that illustrates an example of the configuration of the sensor chip according to the third embodiment.

A sensor chip according to a third embodiment of the present technology will be described with reference to FIGS. 7 to 10. Note that a same reference numeral will be assigned to a configuration common to the sensor chip 11 illustrated in FIG. 1 among blocks configuring the sensor chip 11B illustrated in FIGS. 7 to 10, and detailed description thereof will not be presented. FIG. 7 illustrates a perspective view of the sensor chip 11B, and FIG. 8 illustrates a block diagram of the sensor chip 11B.

As illustrated in FIG. 7, the sensor chip 11B has a stacking structure in which a sensor substrate 51 in which a pixel array unit 12 is formed and a logic substrate 52 in which a global control circuit 13 is formed are stacked. Furthermore, the sensor chip 11B has a connection configuration in which a control line 21 of the sensor substrate 51 and the global control circuit 13 of the logic substrate 52 are connected in a peripheral area of the sensor chip 11B not overlapping the pixel array unit 12 in the plan view. In other words, in the example illustrated in FIG. 7, in the sensor chip 11B, a plurality of control lines 21 arranged along the column direction of sensor elements arranged in the pixel array unit 12 in a matrix pattern are connected to the global control circuit 13 side on the upper side of the sensor substrate 51.

Thus, in the sensor chip 11B, a global control signal output from the global control circuit 13, as denoted by a white arrow in FIG. 7, is supplied from the upper side of the sensor substrate 51 to sensor elements of the pixel array unit 12. At this time, the longitudinal direction of the global control circuit 13 is arranged along the long side of the pixel array unit 12, and the sensor chip 11B has a configuration having a shortest distance from the global control circuit 13 to the sensor elements of the pixel array unit 12.

The configuration of the sensor chip 11B will be further described with reference to FIG. 8.

In the sensor substrate 51, the pixel array unit 12 and through silicon via (TSV) areas 53-1 to 53-3 are arranged. In the logic substrate 52, the global control circuit 13, a rolling control circuit 14, a column ADC 15, a logic circuit 17, and TSV areas 54-1 to 54-3 are arranged. For example, in the sensor chip 11B, a sensor signal output from a sensor element of the pixel array unit 12 is converted from analog to digital by the column ADC 15, and various kinds of signal processing is performed for the digital sensor signal by the logic circuit 17, and then, a resultant signal is output to the outside.

The TSV areas 53-1 to 53-3 and the TSV areas 54-1 to 54-3 are areas in which through electrodes used for electrically connecting the sensor substrate 51 and the logic substrate 52 are formed, and, for example, a through electrode is arranged for each control line 21. Accordingly, the TSV areas 53-1 to 53-3 and the TSV areas 54-1 to 54-3 are arranged to overlap each other when the sensor substrate 51 and the logic substrate 52 are stacked. Note that, instead of connections using the through electrodes in the TSV areas 54, for example, micro bumps, copper (Cu—Cu) connections, or the like can be used.

The sensor chip 11B configured in this way, similar to the sensor chip 11 illustrated in FIG. 1, by employing a layout in which the global control circuit 13 is arranged along the long side of the pixel array unit 12, can configure the wiring length of the control line 21 to be short. Accordingly, the sensor chip 11B, similar to the sensor chip 11 illustrated in FIG. 1, can perform control for the sensor elements at a higher speed.

Figure 9:
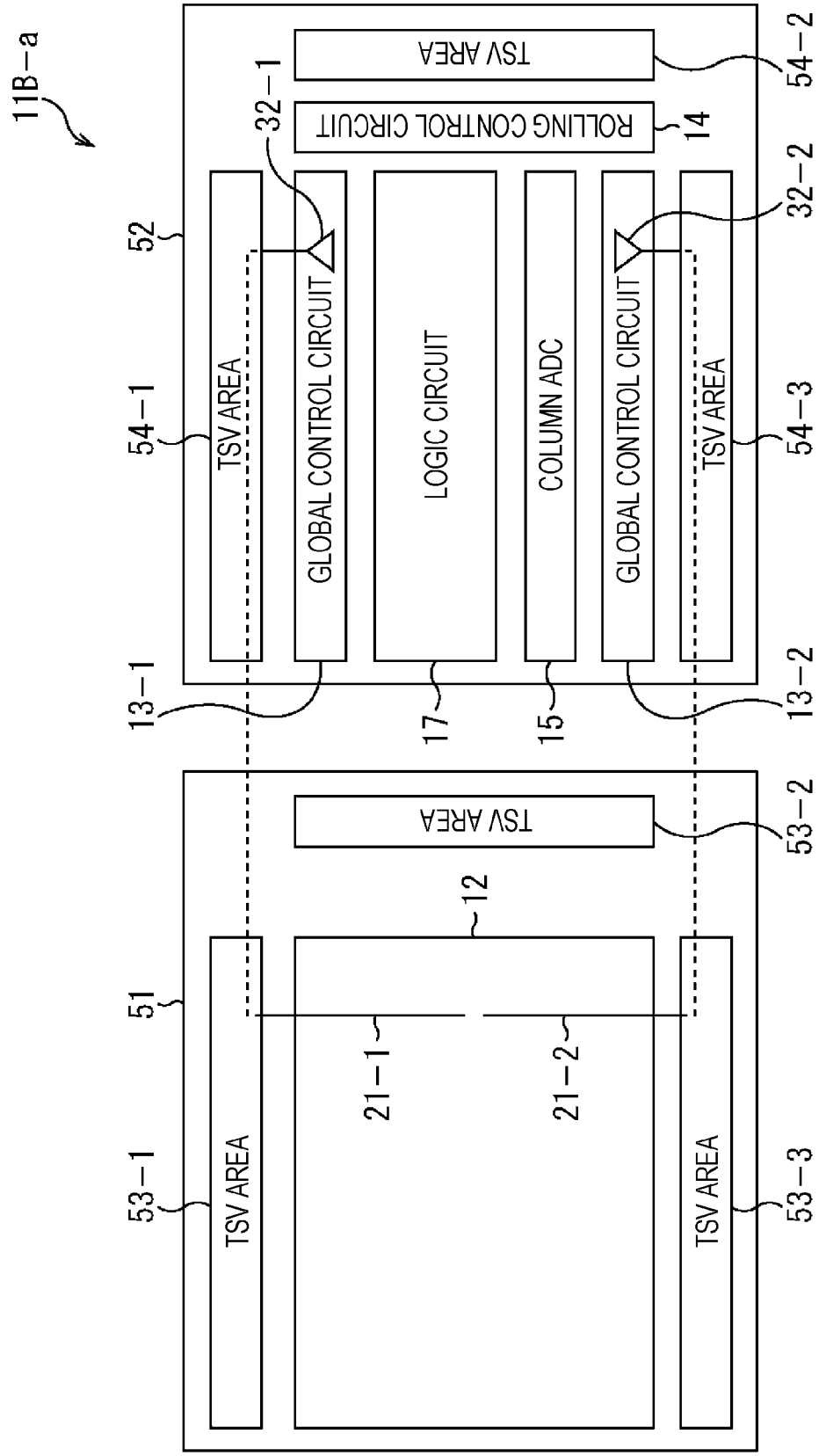
FIG. 9 is a block diagram that illustrates a first modified example of the sensor chip illustrated in FIG. 8.

FIG. 9 is a block diagram that illustrates a first modified example of the sensor chip 11B illustrated in FIG. 8. Note that a same reference numeral will be assigned to a configuration common to the sensor chip 11B illustrated in FIG. 8 among blocks configuring a sensor chip 11B-a illustrated in FIG. 9, and detailed description thereof will not be presented.

In other words, as illustrated in FIG. 9, the sensor chip 11B-a has a stacking structure in which a sensor substrate 51 in which a pixel array unit 12 is formed and a logic substrate 52 in which a global control circuit 13 is formed are stacked to have a configuration common to that of the sensor chip 11B illustrated in FIG. 8.

On the other hand, in the sensor chip 11B-a, two global control circuits 13-1 and 13-2 are arranged in the logic substrate 52 along the upper side and the lower side of the pixel array unit 12, and two control lines 21-1 and 21-2 are arranged to be separate at the center of the column of the sensor elements arranged in the pixel array unit 12 in a matrix pattern, which is different from the configuration of the sensor chip 11B illustrated in FIG. 8.

In other words, in the sensor chip 11B-a, similar to the sensor chip 11-*b* illustrated in FIG. 5, the driving element 32-1 is connected to the upper end of the control line 21-1, and the driving element 32-2 is connected to the lower end of the control line 21-2. Accordingly, in the sensor chip 11B-a, the driving element 32-1 included in the global control circuit 13-1 is configured to supply a global control signal from the upper end of the control line 21-1 to the sensor element arranged on a further upper side than the center of the pixel array unit 12. In addition, in the sensor chip 11B-a, the driving element 32-2 included in the global control circuit 13-2 is configured to supply a global control signal from the lower end of the control line 21-2 to a sensor element arranged on a further lower side than the center of the pixel array unit 12.

In the sensor chip 11B-a configured in this way, a distance from the driving element 32-1 to a sensor element arranged at a far end (the lower end in the example illustrated in FIG. 9) of the control line 21-1 and a distance from the driving element 32-2 to a sensor element arranged at a far end (the upper end in the example illustrated in FIG. 9) of the control line 21-2 can be configured to be shorter than those of the sensor chip 11B illustrated in FIG. 8. In this way, the sensor chip 11B-a can further decrease the amount of delay occurring in global control signals output from the global control circuits 13-1 and 13-2 and the slew rate thereof, and accordingly, the control for sensor elements can be performed at a higher speed.

Figure 10:
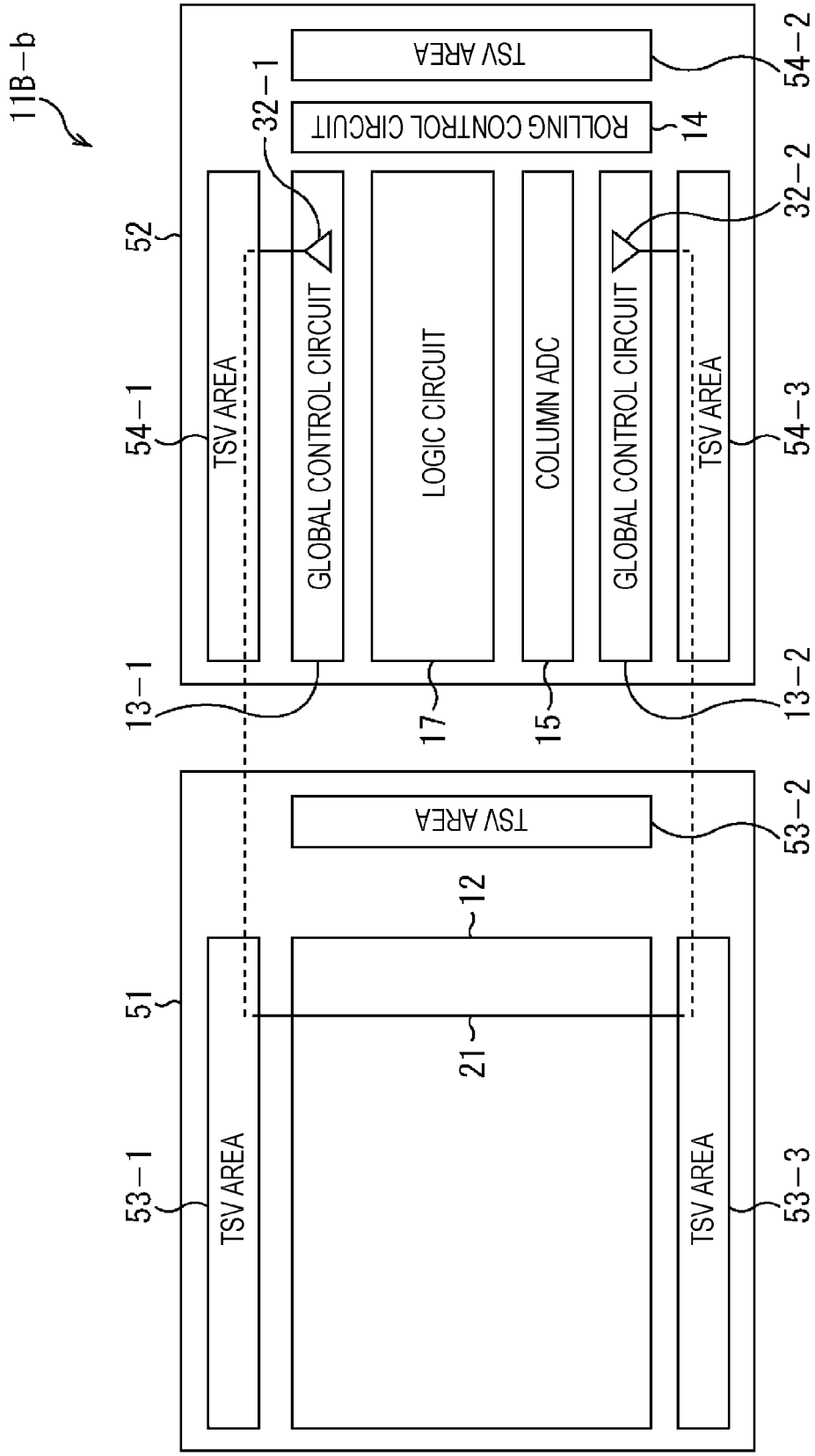
FIG. 10 is a block diagram that illustrates a second modified example of the sensor chip illustrated in FIG. 8.

FIG. 10 is a block diagram that illustrates a second modified example of the sensor chip 11B illustrated in FIG. 8. Note that a same reference numeral will be assigned to a configuration common to the sensor chip 11B illustrated in FIG. 8 among blocks configuring a sensor chip 11B-b illustrated in FIG. 10, and detailed description thereof will not be presented.

In other words, as illustrated in FIG. 10, the sensor chip 11B-b has a stacking structure in which a sensor substrate 51 in which a pixel array unit 12 is formed and a logic substrate 52 in which a global control circuit 13 is formed are stacked to have a configuration common to that of the sensor chip 11B illustrated in FIG. 8.

On the other hand, in the sensor chip 11B-b, two global control circuits 13-1 and 13-2 are arranged in the logic substrate 52 along the upper side and the lower side of the pixel array unit 12, respectively, and the driving elements 32-1 and 32-2 are connected to both ends of the control line 21, which is different from the configuration of the sensor chip 11B illustrated in FIG. 8.

In other words, in the sensor chip 11B-b, similar to the sensor chip 11-a illustrated in FIG. 4, the driving element 32-1 included in the global control circuit 13-1 is configured to supply a global control signal from the upper end of the control line 21, and the driving element 32-2 included in the global control circuit 13-2 is configured to supply a global control signal from the lower end of the control line 21.

In the sensor chip 11B-b configured in this way, a skew between the two driving elements 32-1 and 32-2 can be suppressed, and variations in delay times occurring in global control signals propagating through the control line 21 can be eliminated. Accordingly, the sensor chip 11B-b can perform control for the sensor elements at a higher speed. In addition, in the sensor chip 11B-b, it is necessary to perform control to avoid an increase in the delay difference among the outputs of global control signals so as to prevent the generation of a through current.

In the sensor chip 11B configured as above, in the stacking structure in which the sensor substrate 51 and the logic substrate 52 are stacked, similar to the sensor chip 11 illustrated in FIG. 1, control for the sensor elements can be performed at a higher speed.

Note that, in the configuration example illustrated in FIGS. 8 to 10, the column ADC 15 is configured to read sensor signals from the lower end side of the pixel array unit 12 through the TSV area 53-3 and the TSV area 54-3 arranged on the lower side. Other than such a configuration, for example, a configuration in which two column ADCs 15 are arranged near the upper side and the lower side, and sensor signals are read from the upper end side and the lower end side of the pixel array unit 12 may be employed.

<Fourth Configuration Example of Sensor Chip>

A sensor chip according to a fourth embodiment of the present technology will be described with reference to FIG. 11. Note that a same reference numeral will be assigned to a configuration common to the sensor chip 11B illustrated in FIG. 8 among blocks configuring the sensor chip 11C illustrated in FIG. 11, and detailed description thereof will not be presented.

Figure 11:
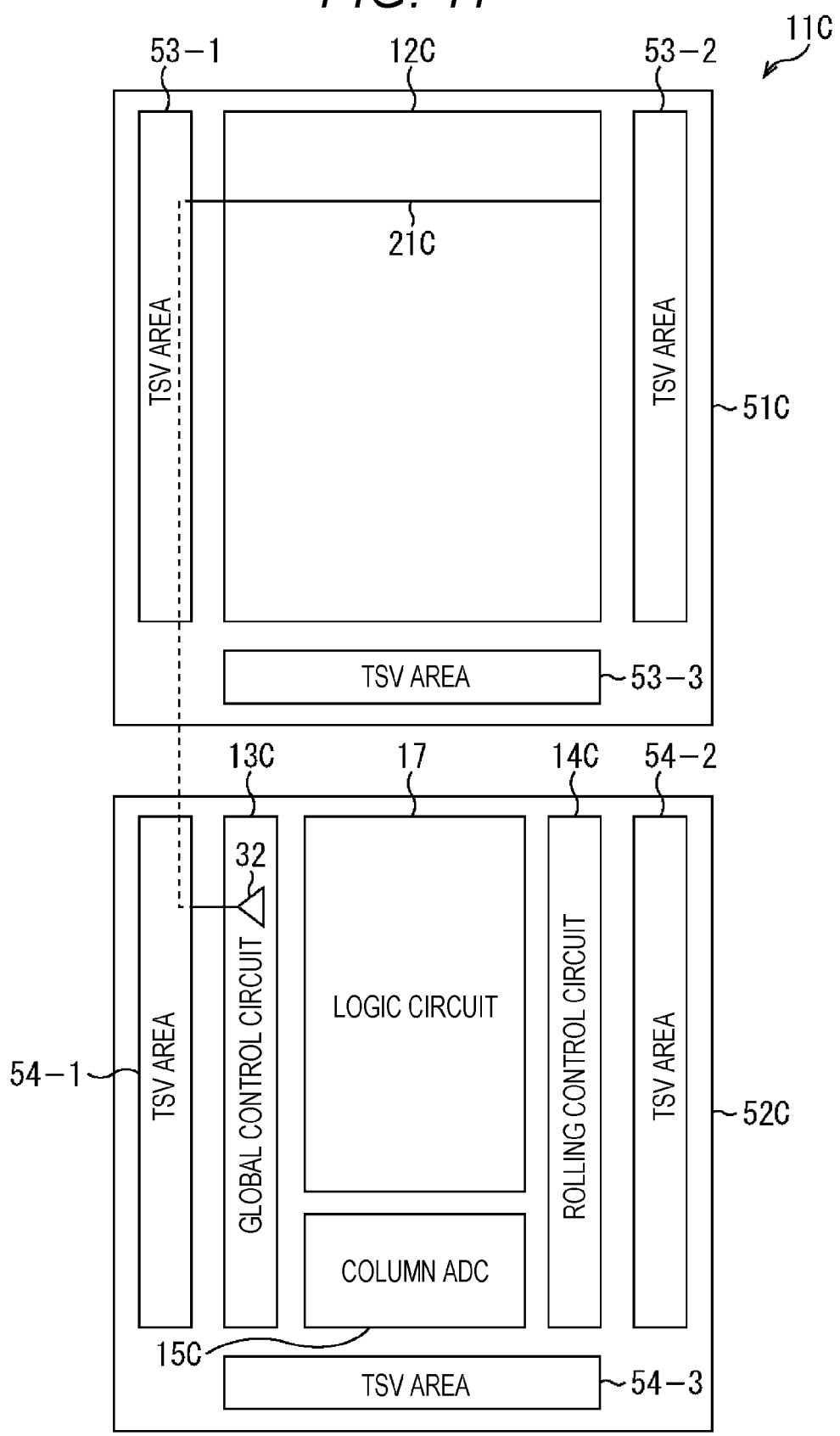
FIG. 11 is a block diagram that illustrates an example of the configuration of a sensor chip according to a fourth embodiment.

In other words, as illustrated in FIG. 11, in the sensor chip 11C, by employing a stacking structure in which a sensor substrate 51 in which a pixel array unit 12 is formed and a logic substrate 52 in which a global control circuit 13 is formed are stacked, a configuration common to the sensor chip 11B illustrated in FIG. 8 is formed. On the other hand, in the sensor chip 11C, similar to the pixel array unit 12A of the sensor chip 11A illustrated in FIG. 6, a pixel array unit 12C is a vertically-long rectangular area, which is different from the configuration of the sensor chip 11B illustrated in FIG. 8. Accordingly, in the sensor chip 11C, a global control circuit 13C is arranged on the left side of the logic substrate 52 along the long side of the pixel array unit 12C. In accompaniment with this, a control line 21C is arranged in a horizontal direction of the pixel array unit 12C for each row of sensor elements arranged in the pixel array unit 12C in a matrix pattern.

In addition, in the sensor chip 11C, a rolling control circuit 14C is arranged on the right side (a side facing the global control circuit 13C) of a logic substrate 52 along the long side of the pixel array unit 12C. Note that, although the global control circuit 13C and the pixel array unit 12C may be arranged on the same side of the logic substrate 52, in such a case, the wiring length of one side is assumed to be increased, and thus, the arrangement as illustrated in the drawing is preferable. In addition, in the sensor chip 11C, a column ADC 15C is arranged on the lower side of the logic substrate 52 along the short side of the pixel array unit 12C. In this way, the reason for arranging the column ADC 15C in a direction orthogonal to the rolling control circuit 14C is for a need for the column ADC 15C to turn on one sensor element connected to one AD converter each time, and a layout in which wirings overlap each other is avoided.

In the sensor chip 11C configured in this way, similar to the sensor chip 11B illustrated in FIG. 8, by employing a layout in which the global control circuit 13C is arranged along the long side of the pixel array unit 12C, the wiring length of the control line 21C can be configured to be short. Accordingly, the sensor chip 11C, similar to the sensor chip 11B illustrated in FIG. 8, can perform control for sensor elements at a higher speed.

<Fifth Configuration Example of Sensor Chip>

A sensor chip according to a fifth embodiment of the present technology will be described with reference to FIG. 12. Note that, a same reference numeral will be assigned to a configuration common to the sensor chip 11B illustrated in FIG. 8 among blocks configuring the sensor chip 11D illustrated in FIG. 12, and detailed description thereof will not be presented.

Figure 12:
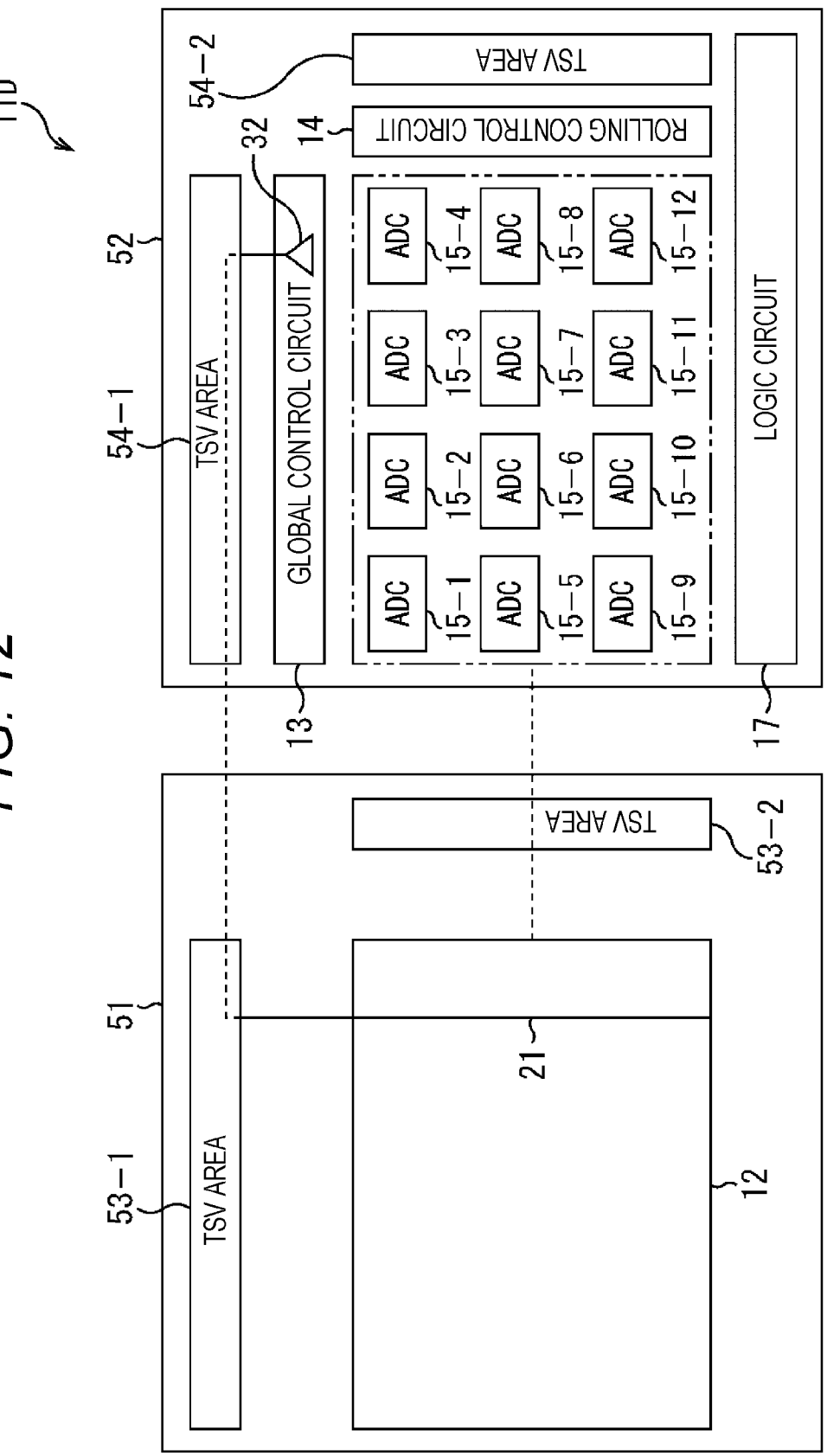
FIG. 12 is a block diagram that illustrates an example of the configuration of a sensor chip according to a fifth embodiment.

In other words, as illustrated in FIG. 12, in the sensor chip 11D, by employing a stacking structure in which a sensor substrate 51 in which a pixel array unit 12 is formed and a logic substrate 52 in which a global control circuit 13 is formed are stacked, a configuration common to the sensor chip 11B illustrated in FIG. 8 is formed. On the other hand, in the sensor chip 11D, in the logic substrate 52, a plurality of ADCs 15, in the example illustrated in FIG. 12, 12 ADCs 15-1 to 15-12 are arranged in correspondence with an area of the sensor substrate 51 in which the pixel array unit 12 is formed, which is different from the configuration of the sensor chip 11B illustrated in FIG. 8.

For example, the sensor chip 11D has a configuration in which an ADC 15 is arranged for each predetermined area of the pixel array unit 12. As illustrated in the drawing, in a case where 12 ADCs 15-1 to 15-12 are used, the ADC 15 is arranged for each area acquired by dividing the pixel array unit 12 into 12 equal parts, and AD conversions of sensor signals output from sensor elements disposed in the areas are performed in parallel. Note that other than the configuration in which the ADC 15 is arranged for each predetermined area of the pixel array unit 12, for example, a configuration in which one ADC 15 is arranged for each one sensor element included in the pixel array unit 12 may be employed.

In the sensor chip 11D configured in this way, similar to the sensor chip 11B illustrated in FIG. 8, by employing a layout in which the global control circuit 13 is arranged along the long side of the pixel array unit 12, the wiring length of the control line 21 can be configured to be short. Accordingly, the sensor chip 11D, similar to the sensor chip 11B illustrated in FIG. 8, can perform control for sensor elements at a higher speed.

In addition, in the sensor chip 11D, a positional relation between the rolling control circuit 14 and the ADC 15 is not limited to that of the column ADC 15 illustrated in FIG. 8. For example, in the sensor chip 11D illustrated in FIG. 12, although the rolling control circuit 14 is arranged on the right side of the logic substrate 52, the rolling control circuit 14 may be arranged on any one of the upper side and the lower side. In other words, when there is no limit on the arrangement position (for example, a center position of the sensor chip 11D with respect to the optical center) of the pixel array unit 12 with respect to the sensor chip 11D or the like, the rolling control circuit 14 may be arranged at any position.

Alternatively, for example, in a case where there is a strong limit between the optical center and the center position of the sensor chip 11D, by arranging the rolling control circuit 14 at a position disposed on a side opposite to an area in which the ADC 15 is arranged with respect to the global control circuit 13, the balance of the layout can be improved. Accordingly, the characteristic of the sensor chip 11D can be improved.

<Sixth Configuration Example of Sensor Chip>

A sensor chip according to a sixth embodiment of the present technology will be described with reference to FIGS. 13 to 22. Note that a same reference numeral will be assigned to a configuration common to the sensor chip 11B illustrated in FIGS. 7 and 8 among blocks configuring the sensor chip 11E illustrated in FIGS. 13 to 22, and detailed description thereof will not be presented.

Figure 13:
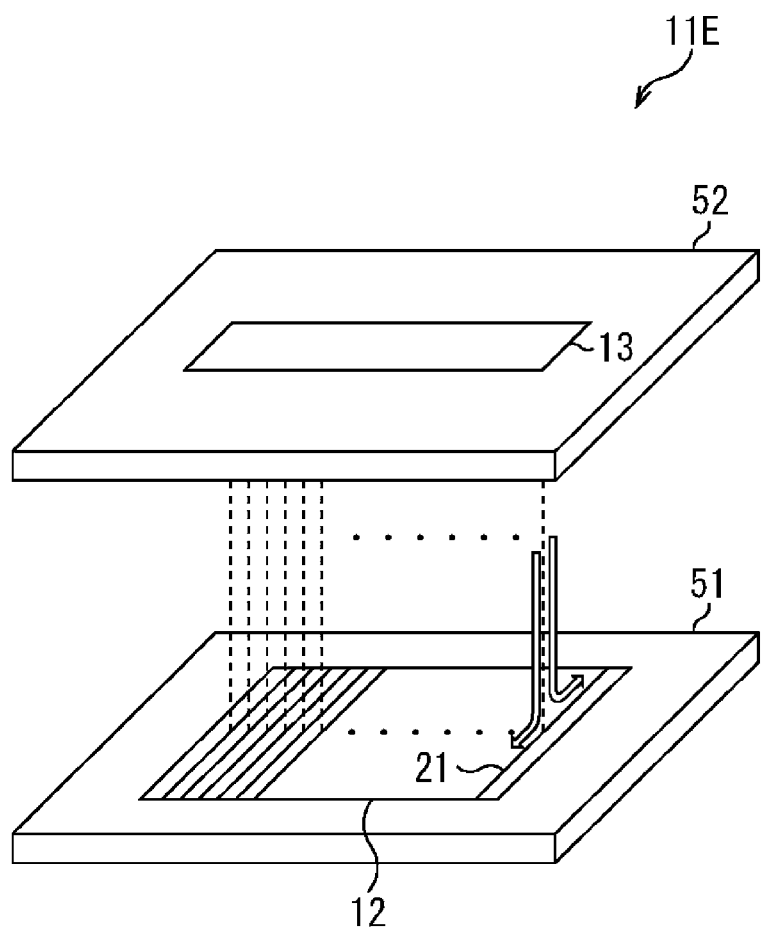
FIG. 13 is a perspective view that illustrates an example of the configuration of a sensor chip according to a sixth embodiment.

As illustrated in FIG. 13, the sensor chip 11E, similar to the sensor chip 11B illustrated in FIG. 7, employs a stacking structure in which a sensor substrate 51 in which a pixel array unit 12 is formed and a logic substrate 52 in which a global control circuit 13 is formed are stacked. Furthermore, the sensor chip 11E has a connection configuration in which the global control circuit 13 is arranged to overlap the center of the pixel array unit 12 in the plan view, and the global control circuit 13 is connected to a control line 21 at the center portion of the pixel array unit 12.

For example, in a case where a connection can be made in the pixel array unit 12 by using a connection between copper (Cu) and copper configuring wirings, a connection using micro bumps or TSVs, or the like, the sensor chip 11E can configure a distance from a driving element 32 to a sensor element arranged at a far end of the control line 21 to be short.

The configuration of the sensor chip 11E will be further described with reference to FIG. 14.

Figure 14:
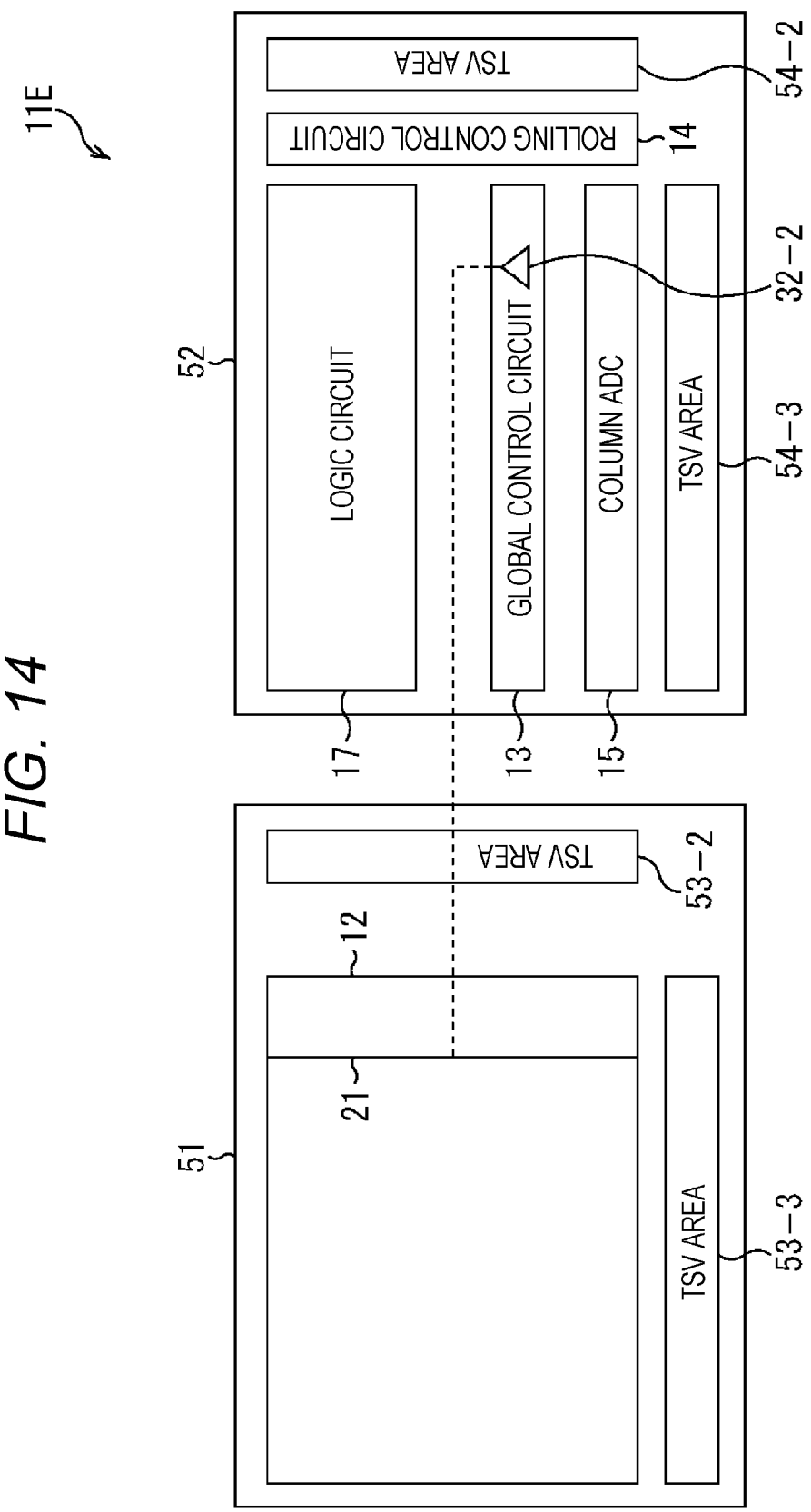
FIG. 14 is a block diagram that illustrates an example of the configuration of a sensor chip according to the sixth embodiment.

As illustrated in FIG. 14, in the sensor substrate 51, the pixel array unit 12 is a horizontally-long rectangular area in which a long side is disposed in the horizontal direction, and a short side is disposed in the vertical direction. Accordingly, in the logic substrate 52, the global control circuit 13 is arranged such that the longitudinal direction is along the long side of the pixel array unit 12. Then, the global control circuit 13 is arranged at approximate center of the logic substrate 52 such that a wiring output from a driving element 32 of the global control circuit 13 is connected to the center of a control line 21 arranged in the vertical direction of the pixel array unit 12. In addition, in the plan view, a configuration may be employed in which a wiring output from a driving element 32 from the global control circuit 13 directly toward the pixel array unit 12 passes through the substrate.

In the sensor chip 11E configured in this way, a distance from the driving element 32 to sensor elements arranged at both ends of the control line 21 can be configured to be short. Thus, since the amount of delay and the slew rate of the global control signal can be improved, the sensor chip 11E can perform control for the sensor elements at a higher speed.

In addition, the configuration as represented in the sensor chip 11E, for example, is appropriate for an application for a ToF sensor.

Figure 15:
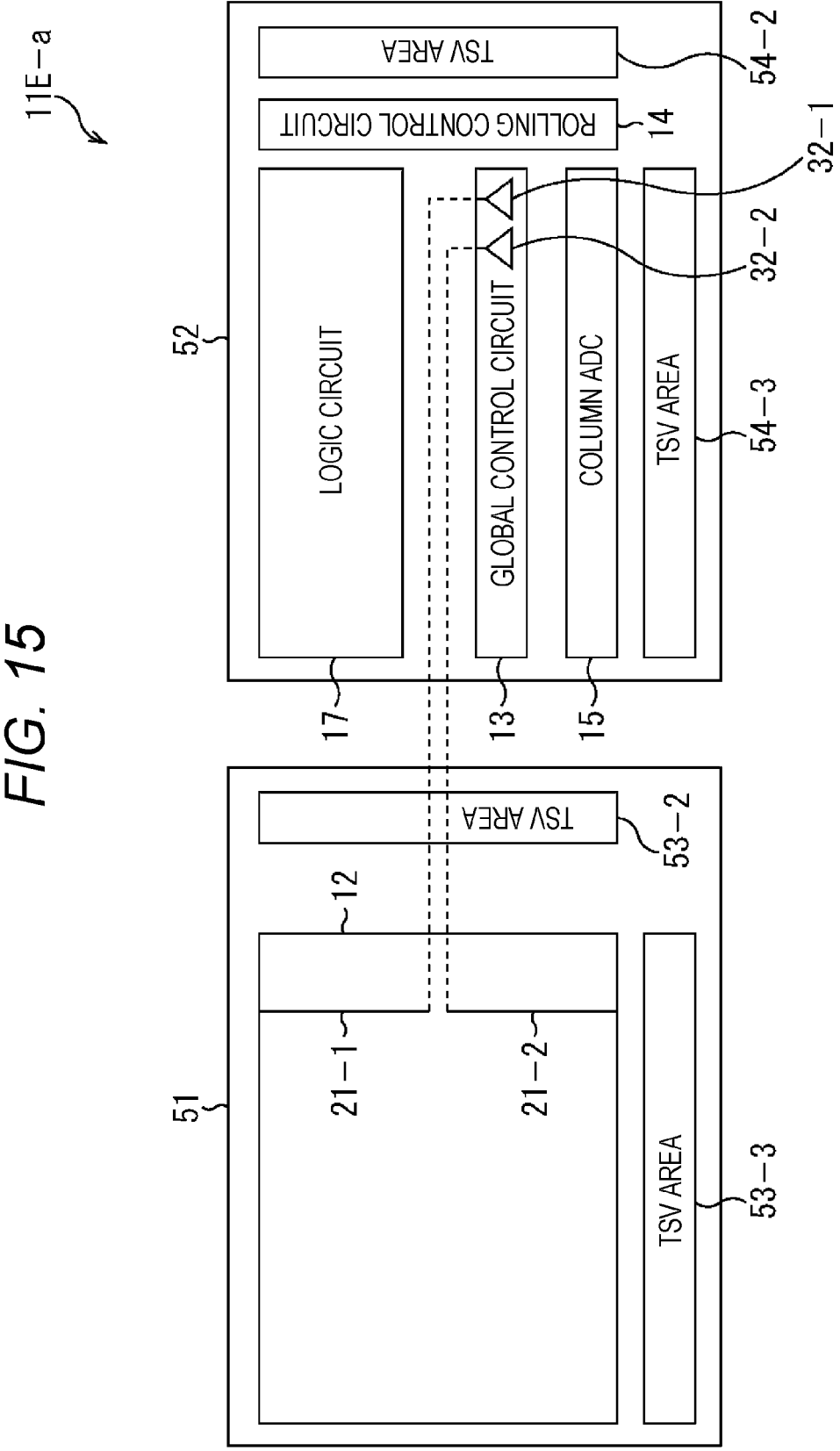
FIG. 15 is a block diagram that illustrates a first modified example of the sensor chip illustrated in FIG. 14.

FIG. 15 is a block diagram that illustrates a first modified example of the sensor chip 11E illustrated in FIG. 14. Note that a same reference numeral will be assigned to a configuration common to the sensor chip 11E illustrated in FIG. 14 among blocks configuring a sensor chip 11E-a illustrated in FIG. 15, and detailed description thereof will not be presented.

In other words, as illustrated in FIG. 15, the sensor chip 11E-a has a stacking structure in which a sensor substrate 51 in which a pixel array unit 12 is formed and a logic substrate 52 in which a global control circuit 13 is formed are stacked to have a configuration common to that of the sensor chip 11E illustrated in FIG. 14. On the other hand, in the sensor chip 11E-a, in the sensor substrate 51, two control lines 21-1 and 21-2 divided from the center are arranged in one row of sensor elements arranged in the pixel array unit 12 in a matrix pattern, which is different from the configuration of the sensor chip 11E illustrated in FIG. 14. In addition, in the sensor chip 11E-a, in the logic substrate 52, the global control circuit 13 includes two driving elements 32-1 and 32-2 for one row of the sensor elements, which is different from the configuration of the sensor chip 11E illustrated in FIG. 14.

Furthermore, the sensor chip 11E-a has a connection configuration in which the driving element 32-1 is connected to a center-side end portion of the control line 21-1, and the driving element 32-2 is connected to a center-side end portion of the control line 21-2. In other words, in the sensor chip 11E-a, among a plurality of sensor elements arranged in one row of the pixel array unit 12, sensor elements arranged on a further upper side than the center are driven by the driving element 32-1 through the control line 21-1, and sensor elements arranged on a further lower side than the center are configured to be driven by the driving element 32-2 through the control line 21-2.

The sensor chip 11E-a configured in this way, similar to the sensor chip 11E illustrated in FIG. 14, can configure a distance from the driving element 32-1 to a sensor element arranged at a far end of the control line 21-1 and a distance from the driving element 32-2 to a sensor element arranged at a far end of the control line 21-2 to be short. Accordingly, the sensor chip 11E-a, similar to the sensor chip 11E illustrated in FIG. 14 can improve the amount of delay and the slew rate of the global control signal.

Figure 16:
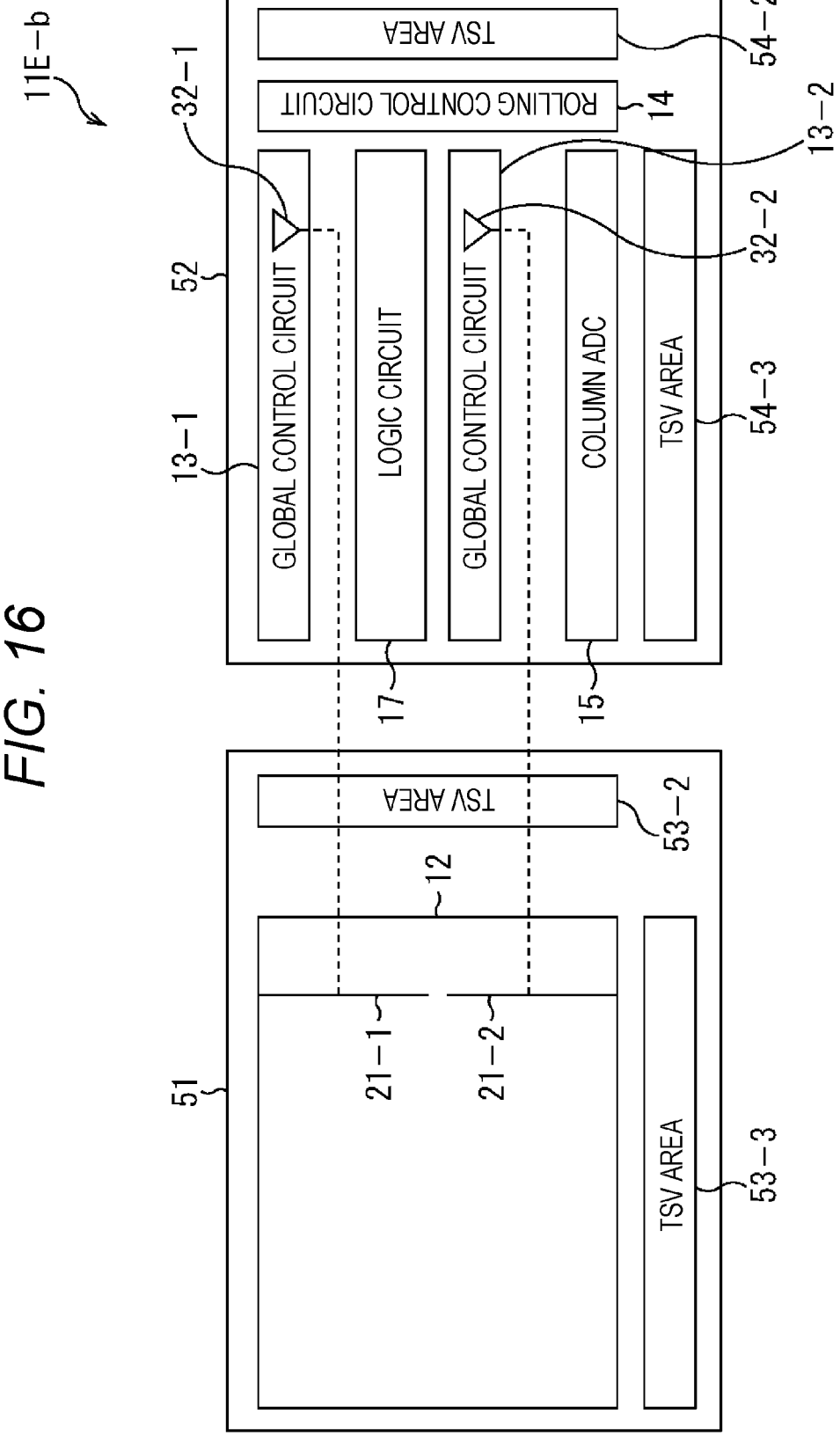
FIG. 16 is a block diagram that illustrates a second modified example of the sensor chip illustrated in FIG. 14.

In addition, in the sensor chip 11E-a, since the load per one driving element 32 can be decreased, the size of the driving element 32 can be decreased to be less than that of the sensor chip 11E illustrated in FIG. 14. In addition, in the sensor chip 11E-a, by employing a configuration in which two driving elements 32 are arranged for one column of sensor elements, the layout of the driving elements 32 is integrated at one place, and accordingly, the whole layout structure can be simplified. FIG. 16 is a block diagram that illustrates a second modified example of the sensor chip 11E illustrated in FIG. 14. Note that a same reference numeral will be assigned to a configuration common to the sensor chip 11E illustrated in FIG. 14 among blocks configuring a sensor chip 11E-b illustrated in FIG. 16, and detailed description thereof will not be presented.

In other words, the sensor chip 11E-b illustrated in FIG. 16 has a stacking structure in which a sensor substrate 51 in which a pixel array unit 12 is formed and a logic substrate 52 in which a global control circuit 13 is formed are stacked to have a configuration common to that of the sensor chip 11E illustrated in FIG. 14.

On the other hand, in the sensor chip 11E-b, in the sensor substrate 51, two control lines 21-1 and 21-2 divided from the center are arranged in one row of sensor elements arranged in the pixel array unit 12 in a matrix pattern, which is different from the configuration of the sensor chip 11E illustrated in FIG. 14. In addition, in the sensor chip 11E-b, in the logic substrate 52, two global control circuits 13-1 and 13-2 are arranged, which is different from the configuration of the sensor chip 11E illustrated in FIG. 14.

Furthermore, the sensor chip 11E-b has a connection configuration in which the driving element 32-1 is connected to the center of the control line 21-1, and the driving element 32-2 is connected to the center of the control line 21-2. In other words, in the sensor chip 11E-b, among a plurality of sensor elements arranged in one row of the pixel array unit 12, sensor elements arranged on a further upper side than the center are driven by the driving element 32-1 through the control line 21-1, and sensor elements arranged on a further lower side than the center are configured to be driven by the driving element 32-2 through the control line 21-2. The sensor chip 11E-b configured in this way can configure a distance from the driving element 32-1 to a sensor element arranged at a far end of the control line 21-1 and a distance from the driving element 32-2 to a sensor element arranged at a far end of the control line 21-2 to be shorter than those of the sensor chip 11E illustrated in FIG. 14. Accordingly, the sensor chip 11E-b can be driven at a higher speed than that of the sensor chip 11E illustrated in FIG. 14 and can further improve the amount of delay and the slew rate of the global control signal.

In addition, as illustrated in FIG. 16, in the sensor chip 11E-b, the global control circuits 13-1 and 13-2 can be arranged in a divisional manner, and accordingly, the logic circuit 17 can be arranged at a center position therebetween. Note that, while not illustrated in the drawing, a column ADC 15 may be arranged at a center position between the global control circuits 13-1 and 13-2.

In addition, the configuration represented in the sensor chip 11E-b, for example, is appropriate for an application to a ToF.

Figure 17:
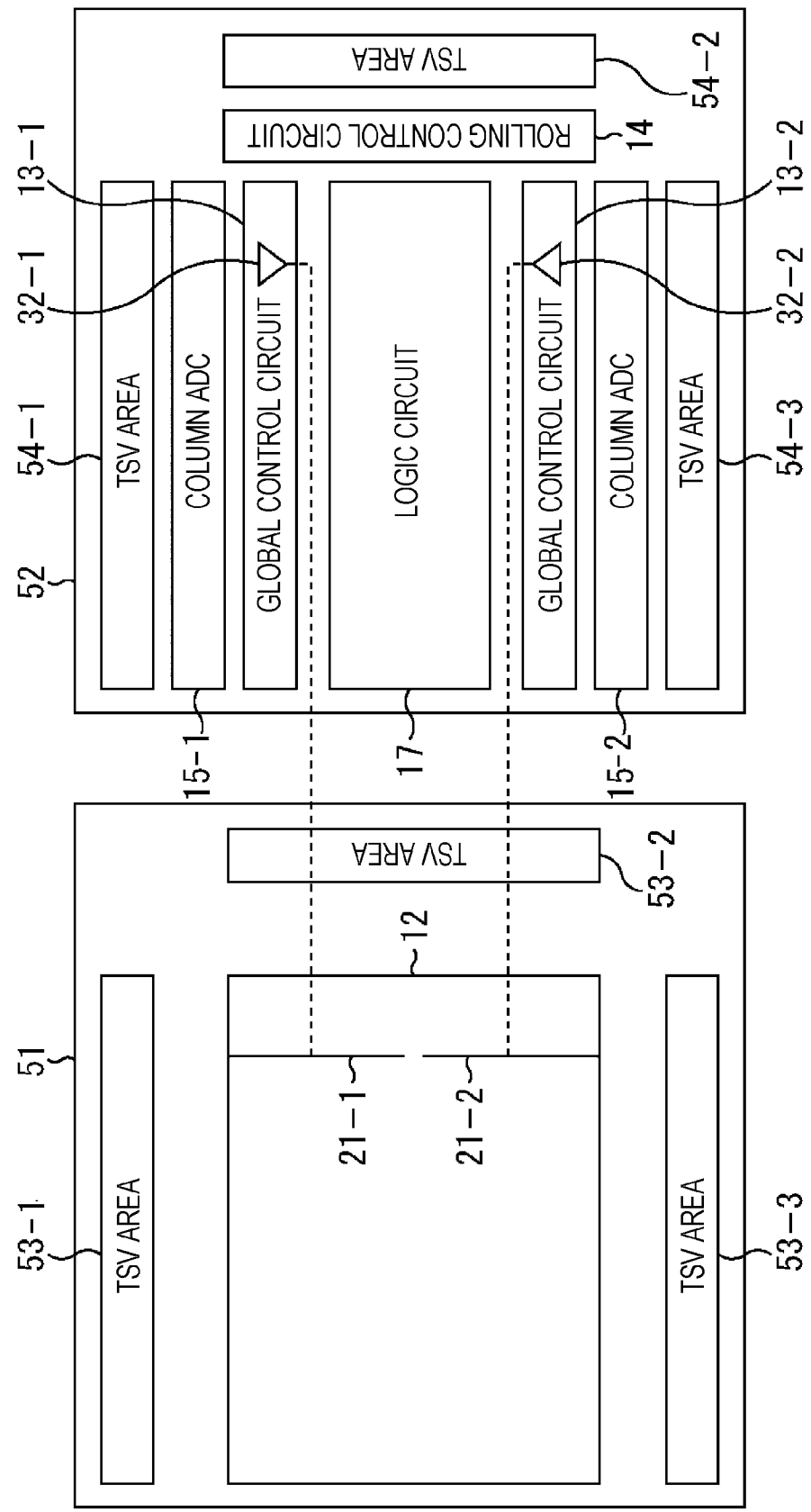
FIG. 17 is a block diagram that illustrates a third modified example of the sensor chip illustrated in FIG. 14.

FIG. 17 is a block diagram that illustrates a third modified example of the sensor chip 11E illustrated in FIG. 14. Note that a same reference numeral will be assigned to a configuration common to the sensor chip 11E illustrated in FIG. 14 among blocks configuring a sensor chip 11E-c illustrated in FIG. 17, and detailed description thereof will not be presented.

In other words, the sensor chip 11E-c illustrated in FIG. 17 has a stacking structure in which a sensor substrate 51 in which a pixel array unit 12 is formed and a logic substrate 52 in which a global control circuit 13 is formed are stacked to have a configuration common to that of the sensor chip 11E illustrated in FIG. 14.

On the other hand, in the sensor chip 11E-c, in the sensor substrate 51, two control lines 21-1 and 21-2 divided from the center are arranged in one row of sensor elements arranged in the pixel array unit 12 in a matrix pattern, which is different from the configuration of the sensor chip 11E illustrated in FIG. 14. In addition, in the sensor chip 11E-c, in the logic substrate 52, two global control circuits 13-1 and 13-2 are arranged, which is different from the configuration of the sensor chip 11E illustrated in FIG. 14.

Furthermore, the sensor chip 11E-c, similar to the sensor chip 11E-b illustrated in FIG. 16, has a connection configuration in which the driving element 32-1 is connected to the center of the control line 21-1, and the driving element 32-2 is connected to the center of the control line 21-2. Accordingly, the sensor chip 11E-c, similar to the sensor chip 11E-b illustrated in FIG. 16, can be driven at a higher speed than that of the sensor chip 11E illustrated in FIG. 14 and can further improve the amount of delay and the slew rate of the global control signal.

In addition, in the sensor chip 11E-c, the column ADC 15-1 is arranged on the upper side of the logic substrate 52, the column ADC 15-2 is arranged on the lower side of the logic substrate 52. The sensor chip 11E-c configured in this way has a structure having a layout that is vertically symmetrical to have improved symmetry, and, as a result, the characteristics of the sensor chip 11E-c can be improved.

Figure 18:
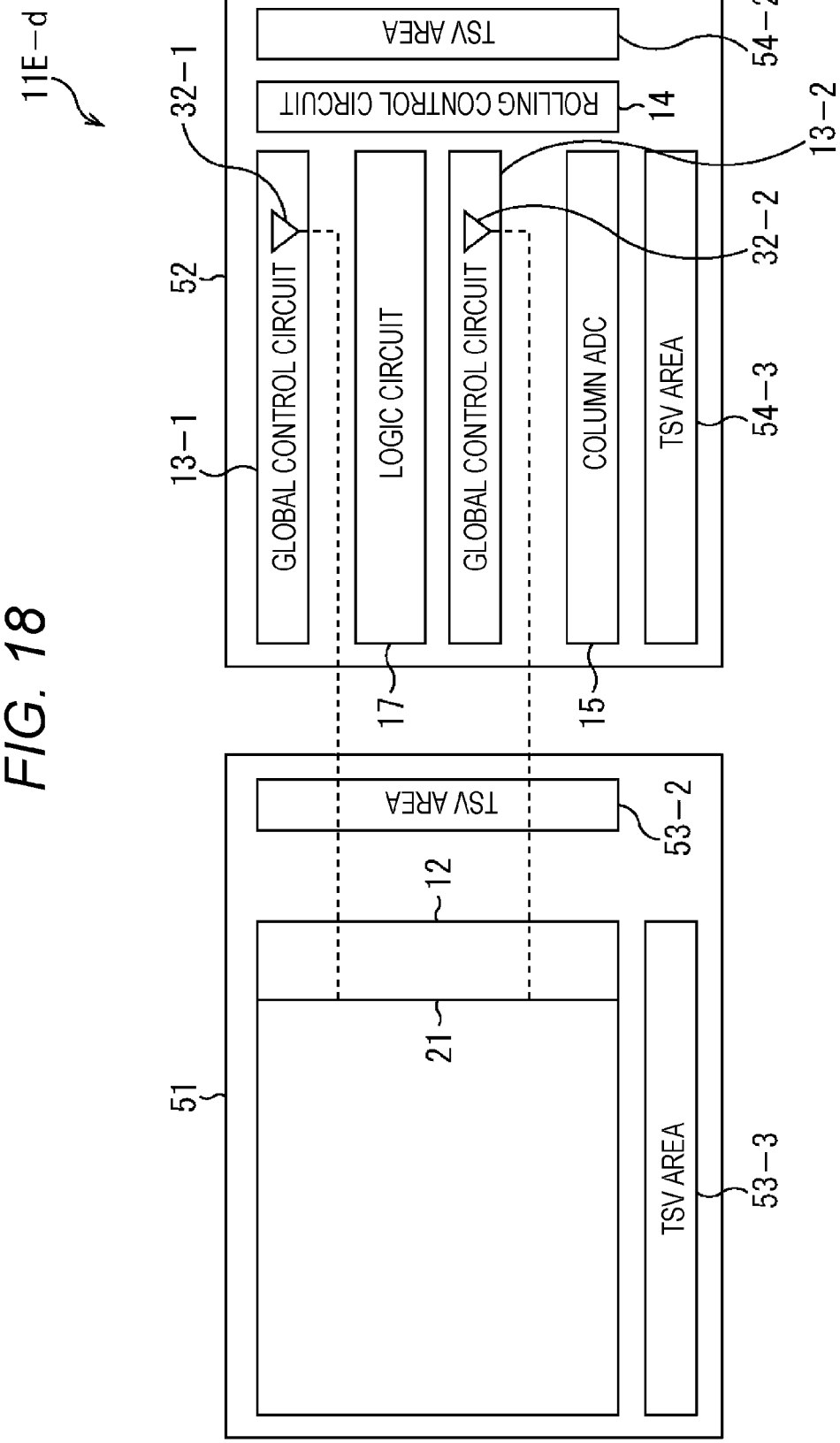
FIG. 18 is a block diagram that illustrates a fourth modified example of the sensor chip illustrated in FIG. 14.

FIG. 18 is a block diagram that illustrates a fourth modified example of the sensor chip 11E illustrated in FIG. 14. Note that a same reference numeral will be assigned to a configuration common to the sensor chip 11E illustrated in FIG. 14 among blocks configuring a sensor chip 11E-d illustrated in FIG. 18, and detailed description thereof will not be presented.

In other words, the sensor chip 11E-d illustrated in FIG. 18 has a stacking structure in which a sensor substrate 51 in which a pixel array unit 12 is formed and a logic substrate 52 in which a global control circuit 13 is formed are stacked to have a configuration common to that of the sensor chip 11E illustrated in FIG. 14.

On the other hand, in the sensor chip 11E-d, in the logic substrate 52, two global control circuits 13-1 and 13-2 are arranged, and a connection form in which the global control circuit 13-1 is connected to approximate center of an upper half of a control line 21, and the global control circuit 13-2 is connected to approximate center of a lower half of the control line 21 is formed is formed, which is different from the configuration of the sensor chip 11E illustrated in FIG. 14. In other words, in the sensor chip 11E-d, a configuration in which one control line 21 acquired by connecting the control lines 21-1 and 21-2 illustrated in FIG. 17 is used is formed. The sensor chip 11E-d configured in this way can suppress a skew between the two driving element 32-1 and the driving element 32-2, and accordingly, variations between delay times occurring in global control signals propagating through the control line 21 can be eliminated. Accordingly, the sensor chip 11E-d can perform control for sensor elements at a higher speed. In addition, it is necessary for the sensor chip 11E-d to perform control such that an increase in the delay difference between outputs of global control signals is avoided to prevent the generation of a through current.

Figure 19:
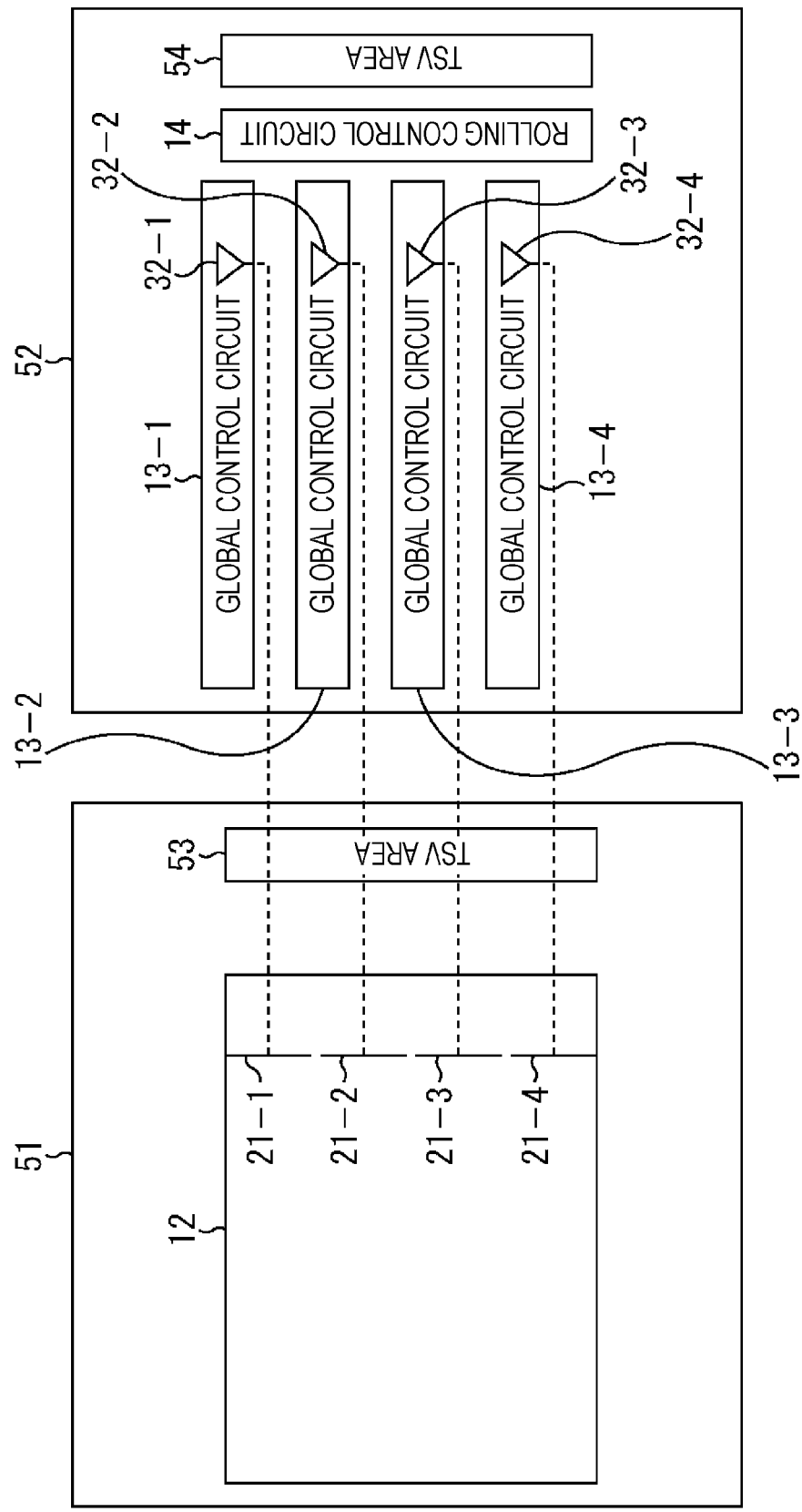
FIG. 19 is a block diagram that illustrates a fifth modified example of the sensor chip illustrated in FIG. 14.

FIG. 19 is a block diagram that illustrates a fifth modified example of the sensor chip 11E illustrated in FIG. 14. Note that a same reference numeral will be assigned to a configuration common to the sensor chip 11E illustrated in FIG. 14 among blocks configuring a sensor chip 11E-e illustrated in FIG. 19, and detailed description thereof will not be presented. In addition, in the sensor chip 11E-e illustrated in FIG. 19, in order to avoid complicating of the drawing, the presentation of a part of blocks configuring the sensor chip 11E-e is omitted.

In other words, the sensor chip 11E-e illustrated in FIG. 19 has a stacking structure in which a sensor substrate 51 in which a pixel array unit 12 is formed and a logic substrate 52 in which a global control circuit 13 is formed are stacked to have a configuration common to that of the sensor chip 11E illustrated in FIG. 14.

On the other hand, in the sensor chip 11E-e, in the sensor substrate 51, four-divided control lines 21-1 to 21-4 are arranged in one row of sensor elements arranged in the pixel array unit 12 in a matrix pattern, which is different from the configuration of the sensor chip 11E illustrated in FIG. 14. In addition, in the sensor chip 11E-e, in the logic substrate 52, four global control circuits 13-1 to 13-4 are arranged, which is different from the configuration of the sensor chip 11E illustrated in FIG. 14.

Furthermore, the sensor chip 11E-e has a connection configuration in which driving elements 32-1 to 32-4 of the global control circuits 13-1 to 13-4 are respectively connected to the centers of the control lines 21-1 to 21-4. Accordingly, the sensor chip 11E-e can configure distances from the driving elements 32-1 to 32-4 to sensor elements arranged at far ends of the control lines 21-1 to 21-4 to be further short. In this way, the sensor chip 11E-e can achieve control for the sensor elements at a further higher speed. Note that, in the sensor chip 11E-e, while the column ADC 15A, the logic circuit 17, and the like are assumed to be divided and arranged, even in such a case, it is necessary to employ a layout not having any influence on the characteristics. Note that, in the configuration example illustrated in FIG. 19, while the description is presented using the four-divided control lines 21-1 to 21-4, the control line 21 may be divided into three or five or more control lines. Furthermore, a configuration in which a corresponding global control circuit 13 is connected to approximate center of each of the divided control lines 21 may be employed.

Figure 20:
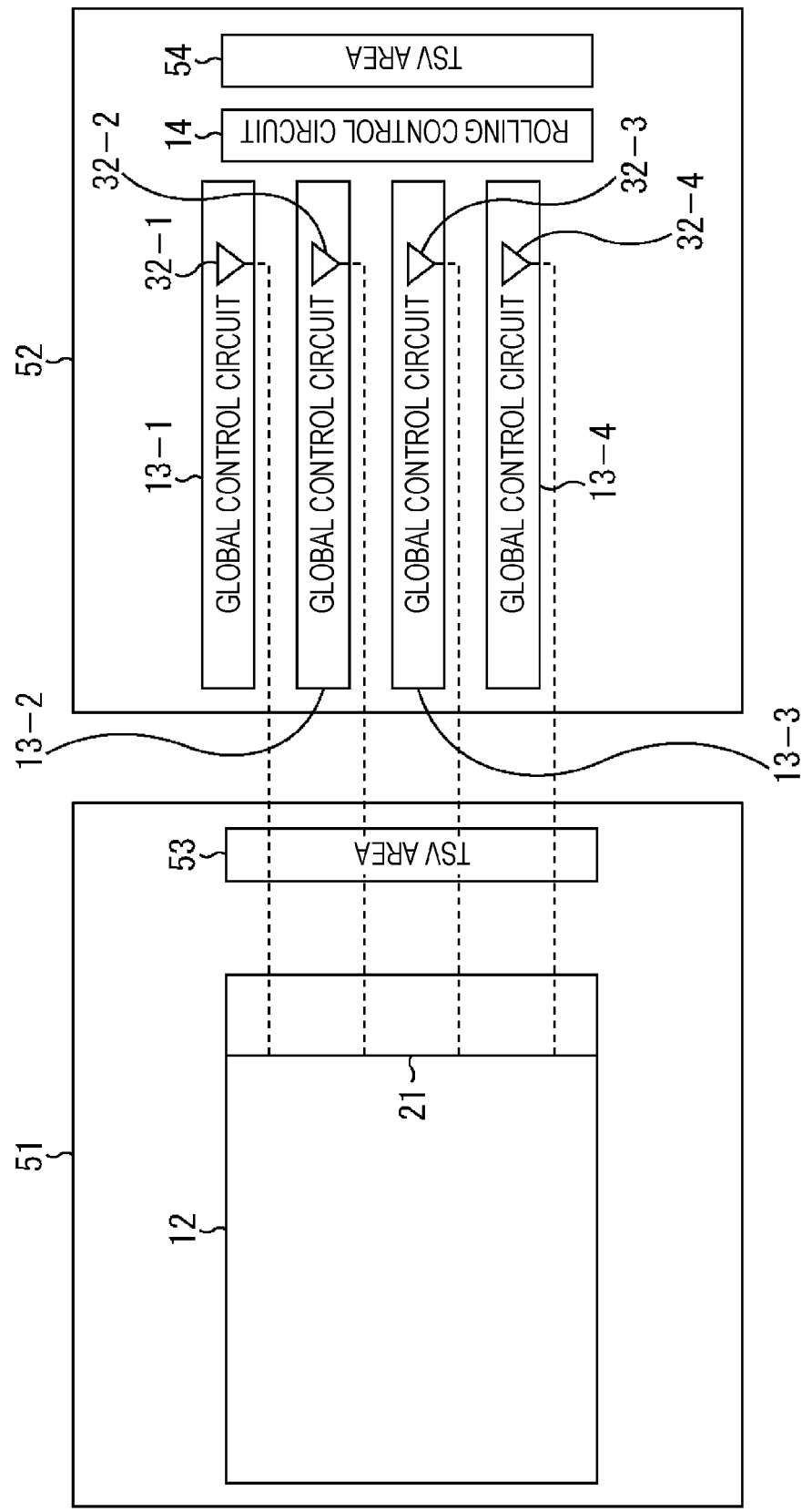
FIG. 20 is a block diagram that illustrates a sixth modified example of the sensor chip illustrated in FIG. 14.

FIG. 20 is a block diagram that illustrates a sixth modified example of the sensor chip 11E illustrated in FIG. 14. Note that, a same reference numeral will be assigned to a configuration common to the sensor chip 11E illustrated in FIG. 14 among blocks configuring a sensor chip 11E-f illustrated in FIG. 20, and detailed description thereof will not be presented.

In other words, the sensor chip 11E-f illustrated in FIG. 20 has a stacking structure in which a sensor substrate 51 in which a pixel array unit 12 is formed and a logic substrate 52 in which a global control circuit 13 is formed are stacked to have a configuration common to that of the sensor chip 11E illustrated in FIG. 14.

On the other hand, the sensor chip 11E-f has a connection configuration in which four global control circuits 13-1 to 13-4 are arranged in the logic substrate 52, and the global control circuits 13-1 to 13-4 are connected to a control line 21 at equal gaps, which is different from the configuration of the sensor chip 11E illustrated in FIG. 14. In other words, the sensor chip 11E-d has a configuration in which one control line 21 to which the control lines 21-1 to 21-4 illustrated in FIG. 19 are connected is used.

The sensor chip 11E-f configured in this way can suppress skews among the four driving elements 32-1 to 32-4, and, variations among delay times occurring in global control signals propagating through the control line 21 can be eliminated. Accordingly, the sensor chip 11E-f can perform control for sensor elements at a higher speed.

Figure 21:
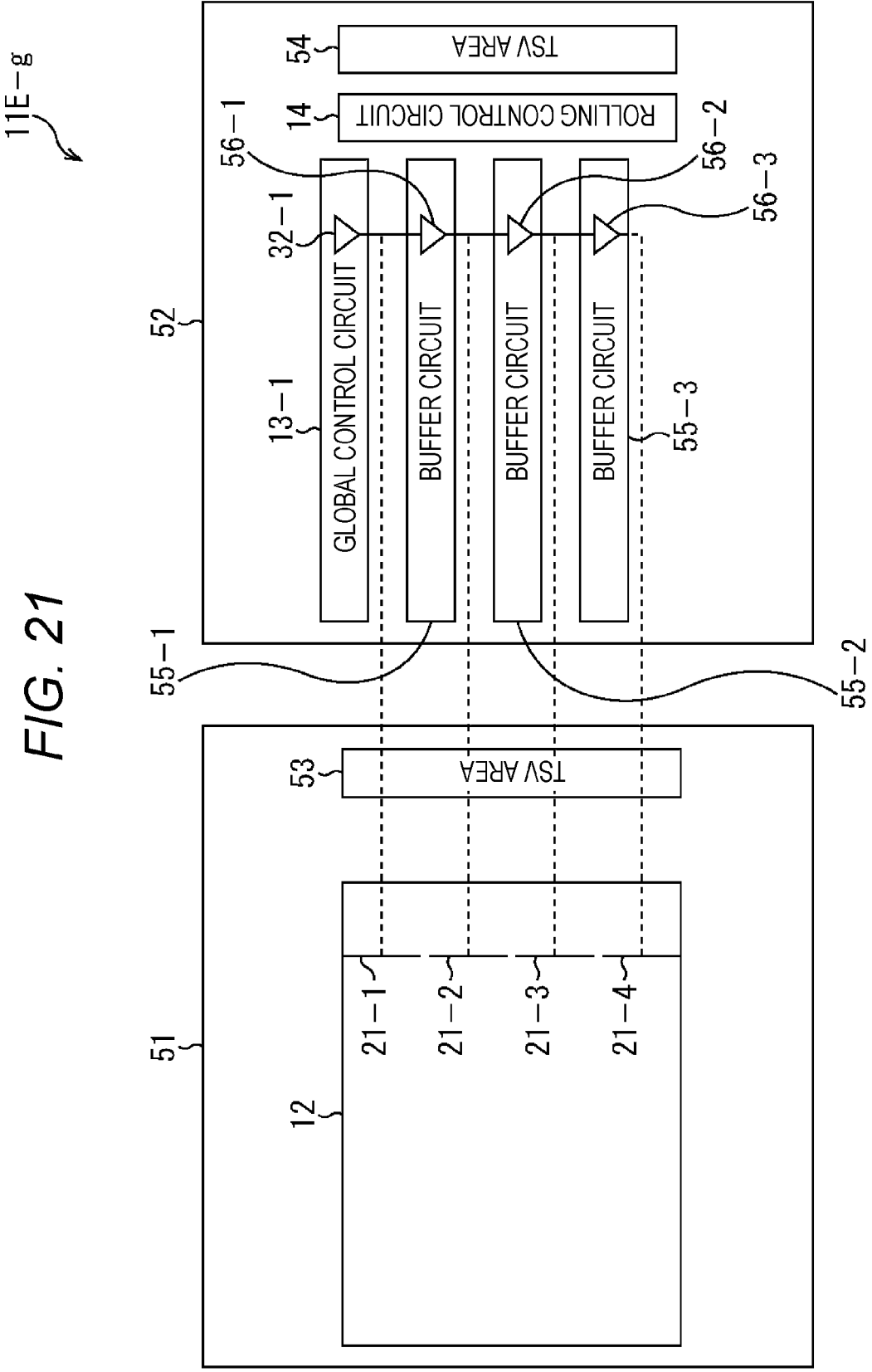
FIG. 21 is a block diagram that illustrates a seventh modified example of the sensor chip illustrated in FIG. 14.

In addition, it is necessary for the sensor chip 11E-f to perform control such that an increase in the delay difference between outputs of global control signals is avoided to prevent the generation of a through current. FIG. 21 is a block diagram that illustrates a seventh modified example of the sensor chip 11E illustrated in FIG. 14. Note that a same reference numeral will be assigned to a configuration common to the sensor chip 11E-e illustrated in FIG. 19 among blocks configuring a sensor chip 11E-g illustrated in FIG. 21, and detailed description thereof will not be presented.

In other words, the sensor chip 11E-g is configured to include one global control circuit 13 and is configured to include buffer circuits 55-1 to 55-3 replacing the global control circuits 13-2 to 13-4 of the sensor chip 11E-e illustrated in FIG. 19. The buffer circuits 55-1 to 55-3 respectively include buffers 56-1 to 56-3, and the outputs of the driving elements 32 of the global control circuit 13 respectively branched in the buffers 56-1 to 56-3 and are connected to four-divided control lines 21-1 to 21-4.

Also in the sensor chip 11E-g configured in this way, similar to the sensor chip 11E-e illustrated in FIG. 19, the control of sensor elements at a further high speed can be achieved.

Figure 22:
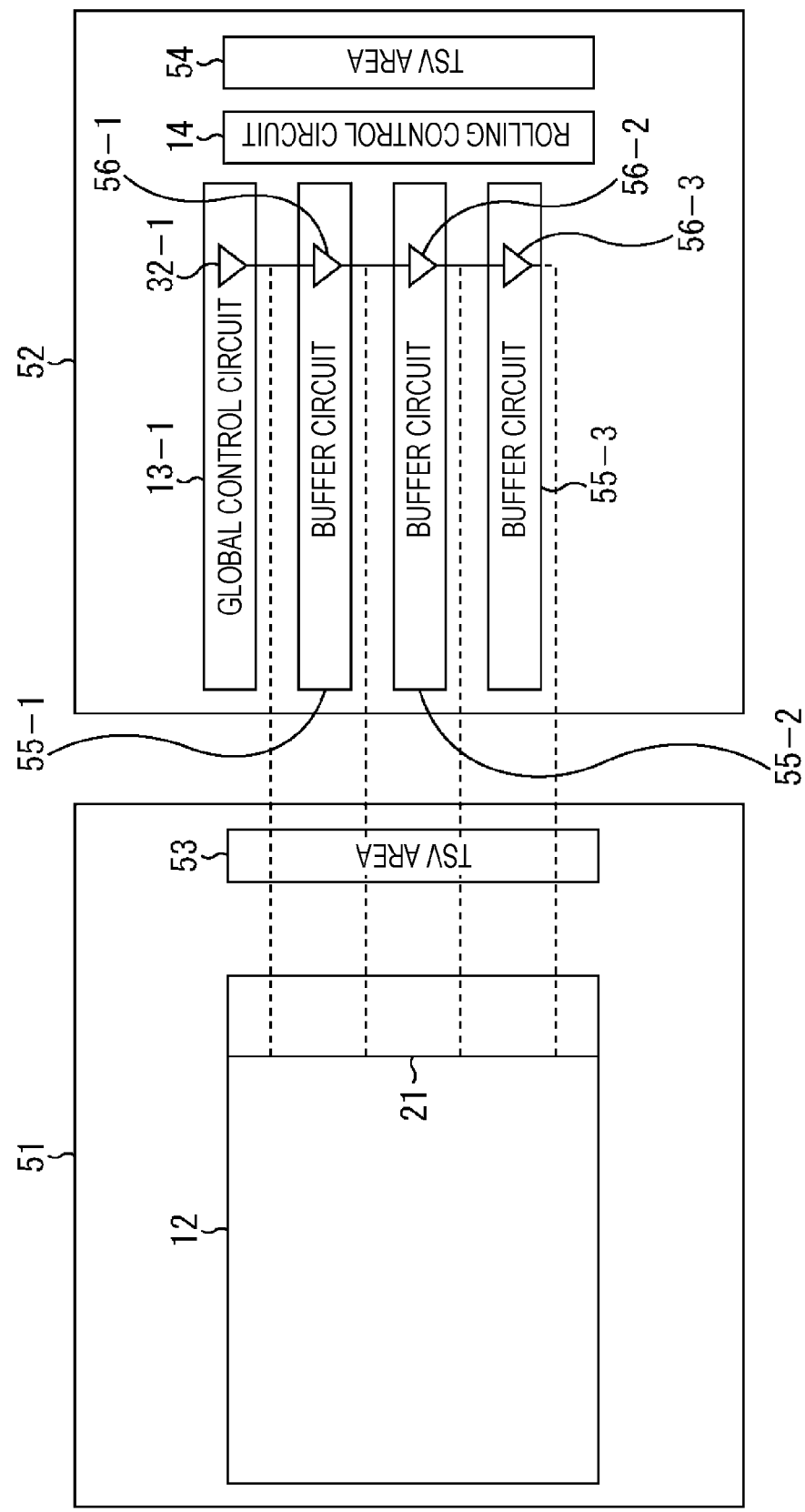
FIG. 22 is a block diagram that illustrates an eighth modified example of the sensor chip illustrated in FIG. 14.

FIG. 22 is a block diagram that illustrates an eighth modified example of the sensor chip 11E illustrated in FIG. 14. Note that a same reference numeral will be assigned to a configuration common to the sensor chip 11E-f illustrated in FIG. 20 among blocks configuring a sensor chip 11E-h illustrated in FIG. 22, and detailed description thereof will not be presented.

In other words, the sensor chip 11E-h is configured to include one global control circuit 13 and is configured to include buffer circuits 55-1 to 55-3 replacing the global control circuits 13-2 to 13-4 of the sensor chip 11E-f illustrated in FIG. 20. The buffer circuits 55-1 to 55-3 respectively include buffers 56-1 to 56-3, and the outputs of the driving elements 32 of the global control circuit 13 respectively branch to the buffers 56-1 to 56-3 and are connected to a control line 21.

Also in the sensor chip 11E-h configured in this way, similar to the sensor chip 11E-f illustrated in FIG. 20, the control of sensor elements at a further high speed can be achieved.

<Seventh Configuration Example of Sensor Chip>

A sensor chip according to a seventh embodiment of the present technology will be described with reference to FIGS. 23 to 25. Note that a same reference numeral will be assigned to a configuration common to the sensor chip 11E illustrated in FIG. 13 among blocks configuring the sensor chip 11F illustrated in FIGS. 23 to 25, and detailed description thereof will not be presented.

Figure 23:
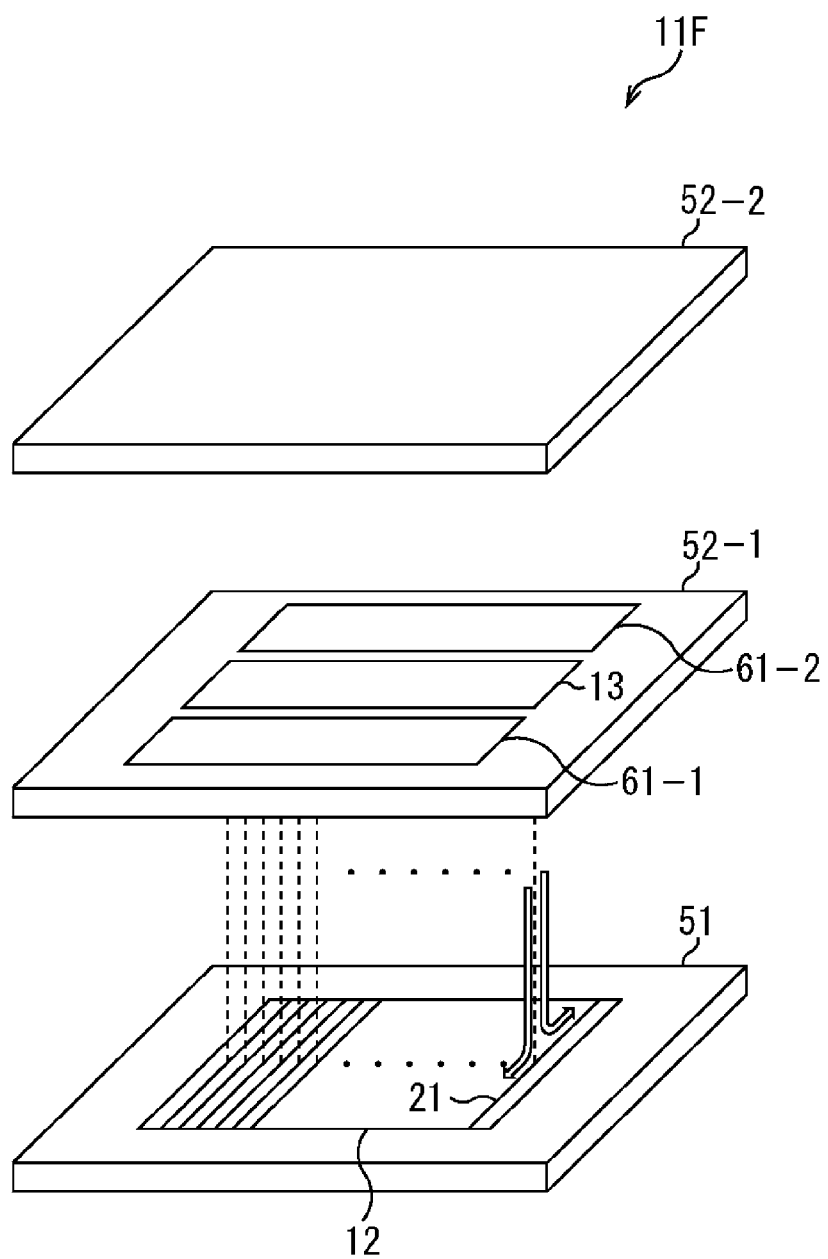
FIG. 23 is a perspective view that illustrates an example of the configuration of a sensor chip according to a seventh embodiment.

In other words, the sensor chip 11F illustrated in FIG. 23 has a stacking structure in which a sensor substrate 51 and two logic substrates 52-1 and 52-2 are stacked.

In other words, the present technology can be applied to a structure in which three semiconductor substrates are stacked.

As illustrated in FIG. 23, the sensor chip 11F has a configuration in which a pixel array unit 12 is formed in a sensor substrate 51 of a first layer, a global control circuit 13 and memories 61-1 and 61-2 are formed in a logic substrate 52-1 of a second layer, and, for example, a column ADC 15, a logic circuit 17, and the like not illustrated in the drawing are formed in a logic substrate 52-2 of a third layer.

Also in the sensor chip 11F configured in this way, by arranging a global control circuit 13 in the logic substrate 52-1 in the longitudinal direction of the pixel array unit 12 of the sensor substrate 51, similar to the sensor chip 11E illustrated in FIG. 13, control of sensor elements can be performed at a higher speed.

In addition, in the sensor chip 11F in which sensor substrate 51, the logic substrate 52-1, and the logic substrate 52-2 are stacked in the mentioned order, the global control circuit 13 is preferably arranged at the center of the logic substrate 52-1 stacked between the sensor substrate 51 and the logic substrate 52-2. Accordingly, a distance between the global control circuit 13 to a sensor element arranged at a far end of a control line 21 can be configured to be short. It is apparent that the layout is not limited to the layout illustrated in FIG. 23, as long as the distance from the global control circuit 13 to the sensor element arranged at the far end of the control line 21 can be configured to be short.

Figure 24:
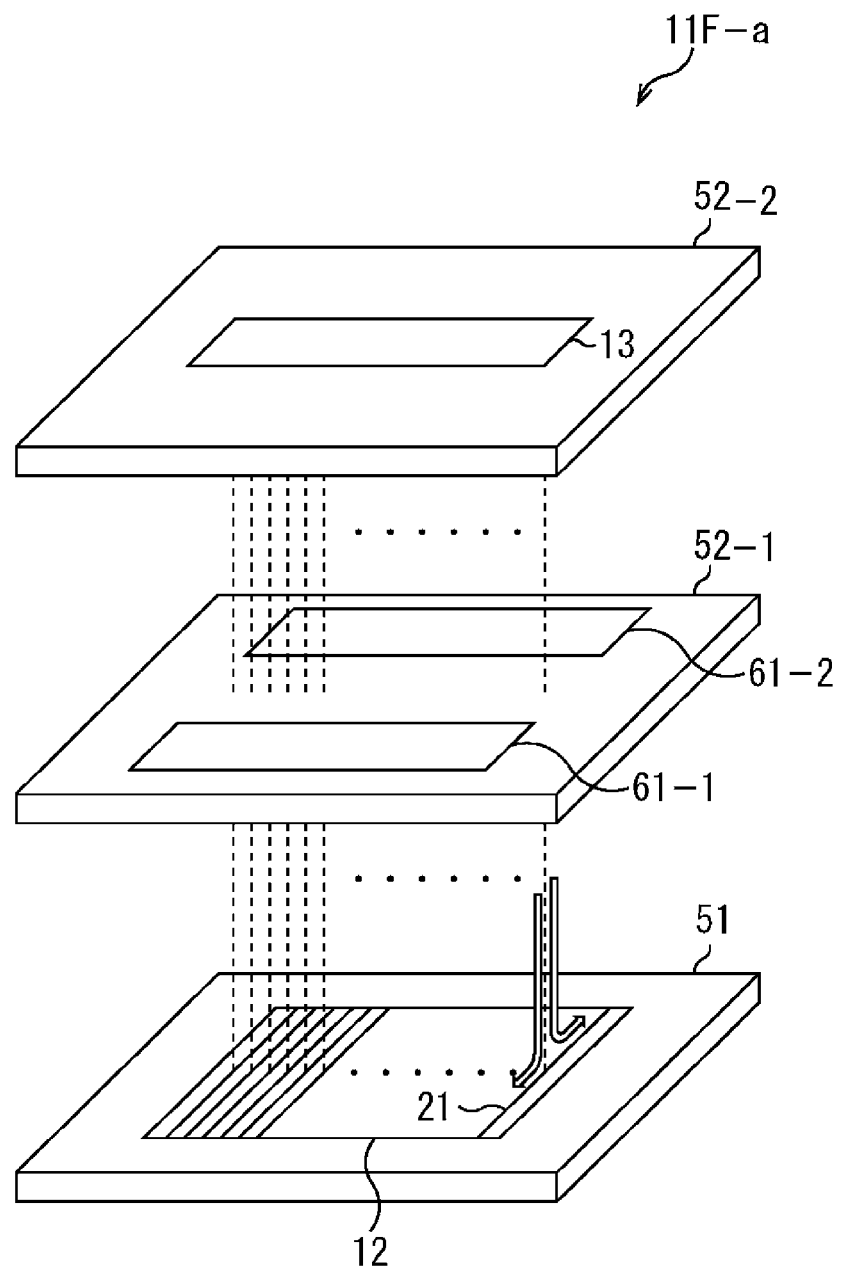
FIG. 24 is a perspective view that illustrates a first modified example of the sensor chip illustrated in FIG. 23.

FIG. 24 is a perspective view that illustrates a first modified example of the sensor chip 11F illustrated in FIG. 23.

As illustrated in FIG. 24, the sensor chip 11F-a has a configuration in which a pixel array unit 12 is formed in a sensor substrate 51 of the first layer, memories 61-1 and 61-2 are formed in a logic substrate 52-1 of the second layer, and for example, a global control circuit 13 and a column ADC 15, a logic circuit 17, and the like not illustrated in the drawing are formed in a logic substrate 52-2 of the third layer.

Also in the sensor chip 11F-a configured in this way, by arranging the global control circuit 13 in the logic substrate 52-2 along the longitudinal direction of a pixel array unit 12 of the sensor substrate 51, similar to the sensor chip 11E illustrated in FIG. 13, control of sensor elements can be performed at a higher speed.

Figure 25:
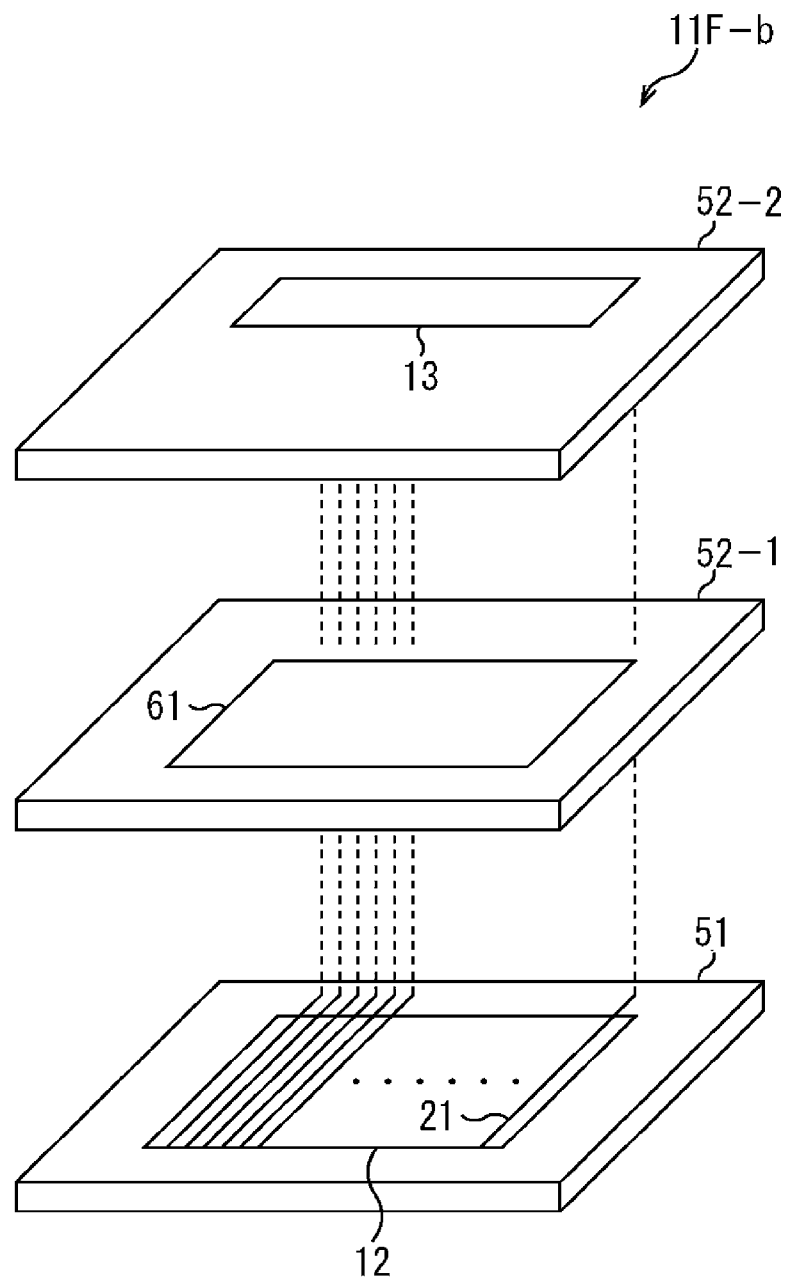
FIG. 25 is a perspective view that illustrates a second modified example of the sensor chip illustrated in FIG. 23.

FIG. 25 is a perspective view that illustrates a second modified example of the sensor chip 11F illustrated in FIG. 23.

As illustrated in FIG. 25, the sensor chip 11F-b has a configuration in which a pixel array unit 12 is formed in a sensor substrate 51 of the first layer, a memory 61 is formed in a logic substrate 52-1 of the second layer, and for example, a global control circuit 13 and a column ADC 15, a logic circuit 17, and the like not illustrated in the drawing are formed in a logic substrate 52-2 of the third layer. In addition, the sensor chip 11F-b, for example, similar to the sensor chip 11B illustrated in FIG. 8, has a connection configuration in which a control line 21 is connected to the global control circuit 13 by using a TSV area formed in a peripheral area of the sensor chip 11F-b.

Also in the sensor chip 11F-b configured in this way, by arranging a global control circuit 13 in the logic substrate 52-2 in the longitudinal direction of the pixel array unit 12 of the sensor substrate 51, similar to the sensor chip 11E illustrated in FIG. 13, control of sensor elements can be performed at a higher speed.

In addition, for example, three or more semiconductor substrates may be stacked, and, as illustrated in FIG. 16 described above, the global control circuit 13 may be arranged at two places, or the global control circuit 13 may be arranged at a plurality of places that are two or more places. In this case, the semiconductor substrate in which a memory 61 is arranged and the arrangement position or the number of divisions of the memory 61 may be appropriately laid out according to the arrangement of the global control circuit 13.

For example, a configuration may be employed in which the pixel array unit 12 is arranged in the semiconductor substrate of the first layer, the column ADC 15, the logic circuit 17, and the like are arranged in the semiconductor substrate of the second layer, and the memory 61 is arranged in the semiconductor substrate of the third layer. Also in such a configuration, by arranging the global control circuit 13 in the semiconductor substrate of the second layer, while the wiring length can be configured to be short, the global control circuit 13 may be arranged in the semiconductor substrate in which the memory 61 is arranged.

<Eighth Configuration Example of Sensor Chip>

A sensor chip according to an eighth embodiment of the present technology will be described with reference to FIGS. 26A to 26E. Note that a same reference numeral will be assigned to a configuration common to the sensor chip 11E illustrated in FIG. 14 among blocks configuring the sensor chip 11G illustrated in FIGS. 26A to 26E, and detailed description thereof will not be presented.

In other words, the arrangement of a global control circuit 13 in the sensor chip 11 is not limited to that described in each embodiment described above, but various layouts as illustrated in FIGS. 26A to 26E may be employed. It is apparent that, in any arrangement, a layout not illustrated in the drawing may be employed as long as the global control circuit 13 is arranged along the long side of the pixel array unit 12.

Figure 26A:
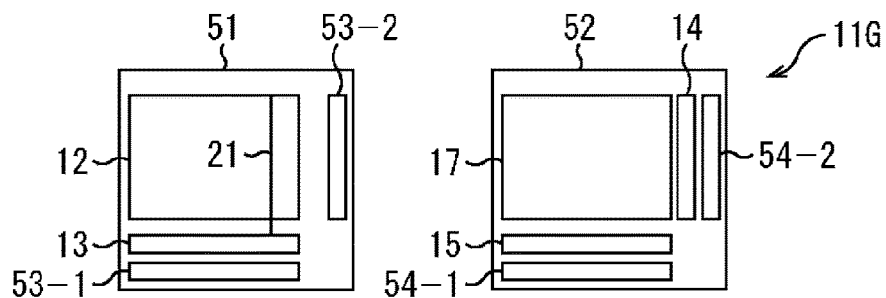
FIGS. 26A to 26E are block diagrams that illustrate examples of the configuration of a sensor chip according to an eighth embodiment and modified examples thereof.

As illustrated in FIG. 26A, a sensor chip 11G has a layout in which a pixel array unit 12 and a global control circuit 13 are arranged in a sensor substrate 51, and a rolling control circuit 14, a column ADC 15, and a logic circuit 17 are arranged in a logic substrate 52. Furthermore, in the sensor chip 11G, the global control circuit 13 is arranged on the lower side of the pixel array unit 12 along the long side of the pixel array unit 12.

Figure 26B:
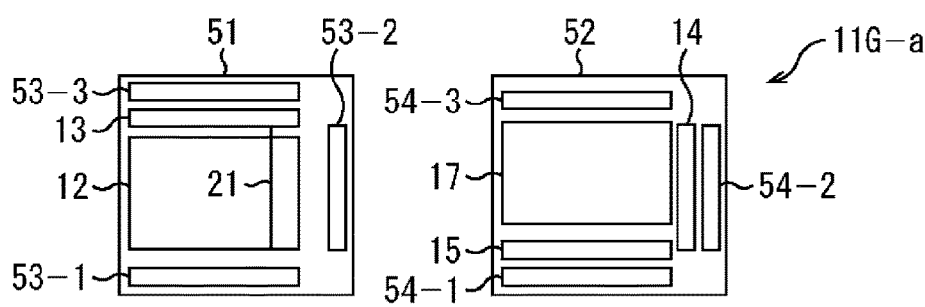

As illustrated in FIG. 26B, a sensor chip 11G-a has a layout in which a pixel array unit 12 and a global control circuit 13 are arranged in a sensor substrate 51, and a rolling control circuit 14, a column ADC 15, and a logic circuit 17 are arranged in a logic substrate 52. Furthermore, in the sensor chip 11G-a, the global control circuit 13 is arranged on the upper side of the pixel array unit 12 along the long side of the pixel array unit 12.

Figure 26C:
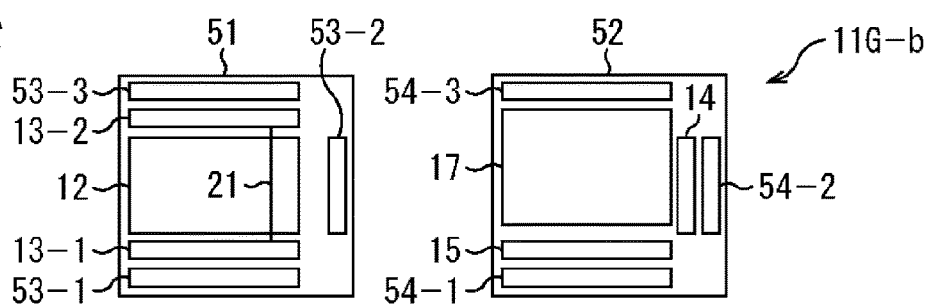
Figure 26D:
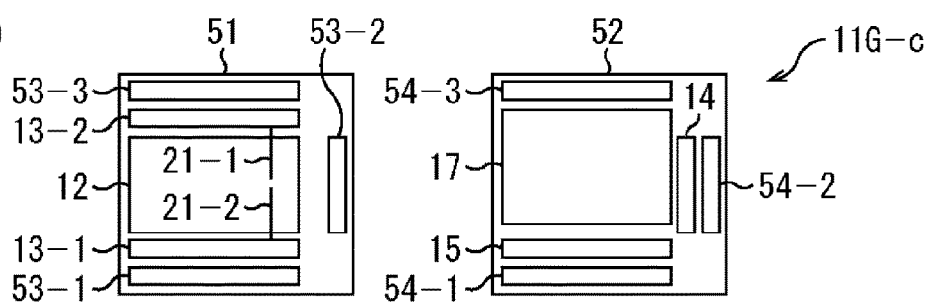
Figure 26E:
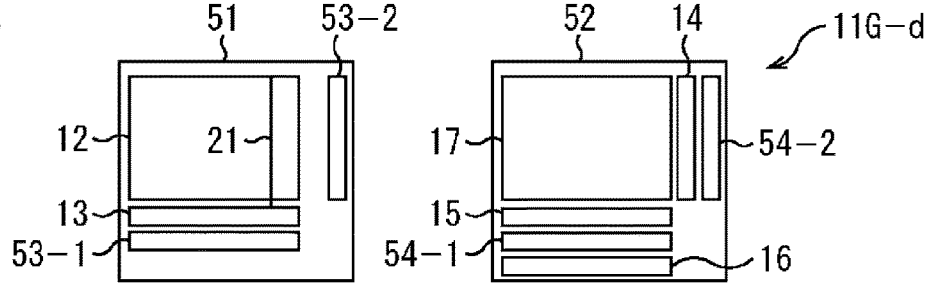

As illustrated in FIG. 26C, a sensor chip 11G-b has a layout in which a pixel array unit 12 and global control circuits 13-1 and 13-2 are arranged in a sensor substrate 51, and a rolling control circuit 14, a column ADC 15, and a logic circuit 17 are arranged in a logic substrate 52. Furthermore, in the sensor chip 11G-b, the global control circuits 13-1 and 13-2 are respectively arranged on the upper side and the lower side of the pixel array unit 12 along the long side of the pixel array unit 12. As illustrated in FIG. 26D, a sensor chip 11G-c has a layout in which a pixel array unit 12 and global control circuits 13-1 and 13-2 are arranged in a sensor substrate 51, and a rolling control circuit 14, a column ADC 15, and a logic circuit 17 are arranged in a logic substrate 52. Furthermore, in the sensor chip 11G-c, the global control circuits 13-1 and 13-2 are respectively arranged on the upper side and the lower side of the pixel array unit 12 along the long side of the pixel array unit 12, and two control lines 21-1 and 21-2 are arranged to be separate at the center of a column of sensor elements arranged in the pixel array unit 12 in a matrix pattern. As illustrated in FIG. 26E, a sensor chip 11G-d has a layout in which a pixel array unit 12 and global control circuits 13-1 and 13-2 are arranged in a sensor substrate 51, and a rolling control circuit 14, a column ADC 15, and a logic circuit 17 are arranged in a logic substrate 52. In the sensor chip 11G-d, an input/output unit 16 is arranged in the logic substrate 52 along the long side of the pixel array unit 12.

For example, the sensor chip 11G-d is configured to supply power from the input/output unit 16 to the global control circuit 13 through a TSV area 54-1 and a TSV area 53-1. Note that, instead of using TSVs, power may be supplied to the global control circuit 13 by using a connection between cooper (Cu) and copper configuring wires, micro bumps, or the like. In addition, for a wiring supplying power to the global control circuit 13, the same connection method as that of the control line 21 may be used or a connection method of a different combination may be used. In addition, other than the configuration in which semiconductor substrates of two layers are stacked, also in the case of a configuration in which semiconductor substrates of three layers are stacked, similarly, the global control circuit 13 is preferably arranged near the input/output unit 16.

In addition, in the various layouts illustrated in FIGS. 26A to 26E, while examples in which the column ADC 15 is arranged on one side of the logic substrate 52 are illustrated, a layout in which the column ADC 15 is arranged on both upper and lower sides of the logic substrate 52 may be employed. Here, the positions of the column ADC 15 and the logic circuit 17 are not limited to those illustrated in the arrangement as illustrated in FIGS. 26A to 26E.

As above, by employing the stacking-type structure in the sensor chip 11, the global control circuit 13 can be arranged in various layouts, and the degree of freedom of the layout is added, and an effect of individually controlling the global control circuit 13 and the rolling control circuit 14 is increased.

<Configuration Example of Distance Image Sensor>

Figure 27:
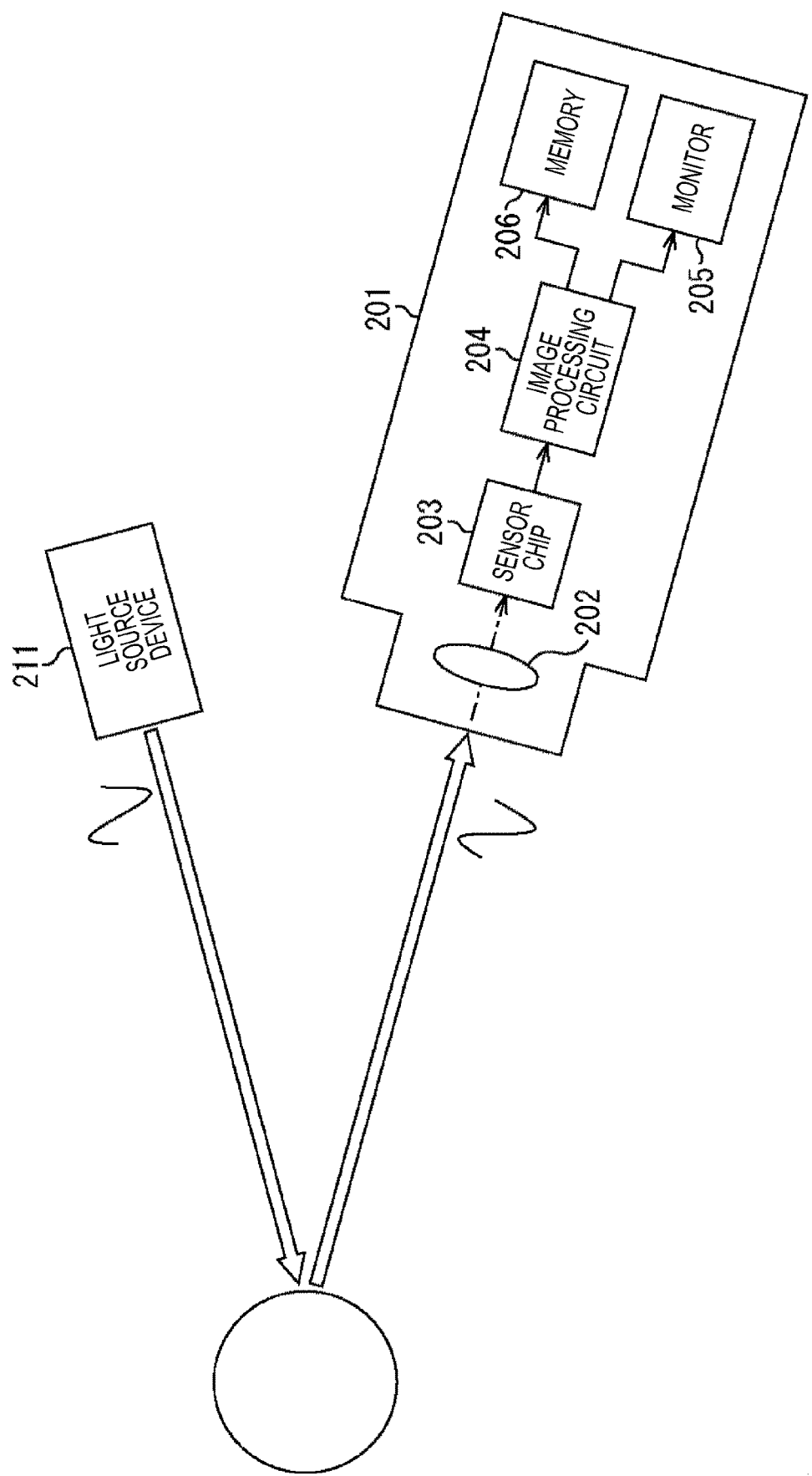
FIG. 27 is a block diagram that illustrates an example of the configuration of an imaging apparatus.

FIG. 27 is a block diagram that illustrates a configuration example of a distance image sensor that is an electronic apparatus using the sensor chip 11.

As illustrated in FIG. 27, the distance image sensor 201 is configured to include an optical system 202, a sensor chip 203, an image processing circuit 204, a monitor 205, and a memory 206. Furthermore, by receiving light (modulated light or pulse light) that is projected from a light source device 211 toward an object and is reflected on the surface of the object, the distance image sensor 201 can acquire a distance image according to a distance up to the object.

The optical system 202 is configured to include one or a plurality of lenses, guides image light (incident light) from an object to the sensor chip 203 and forms an image on a light receiving face (sensor unit) of the sensor chip 203.

As the sensor chip 203, the sensor chip 11 according to each embodiment described above is applied, and a distance signal representing a distance acquired from a reception signal (APD OUT) output from the sensor chip 203 is supplied to the image processing circuit 204.

The image processing circuit 204 performs image processing for building a distance image on the basis of the distance signal supplied from the sensor chip 203, and the distance image (image data) acquired by the image processing is supplied to a monitor 205 to be displayed thereon or is supplied to a memory 206 to be stored (recorded) therein.

In the distance image sensor 201 configured in this way, by applying the sensor chip 11 described above, control is performed at a higher speed, and accordingly, for example, a more accurate distance image can be acquired.

<Example of Use of Image Sensor>

Figure 28:
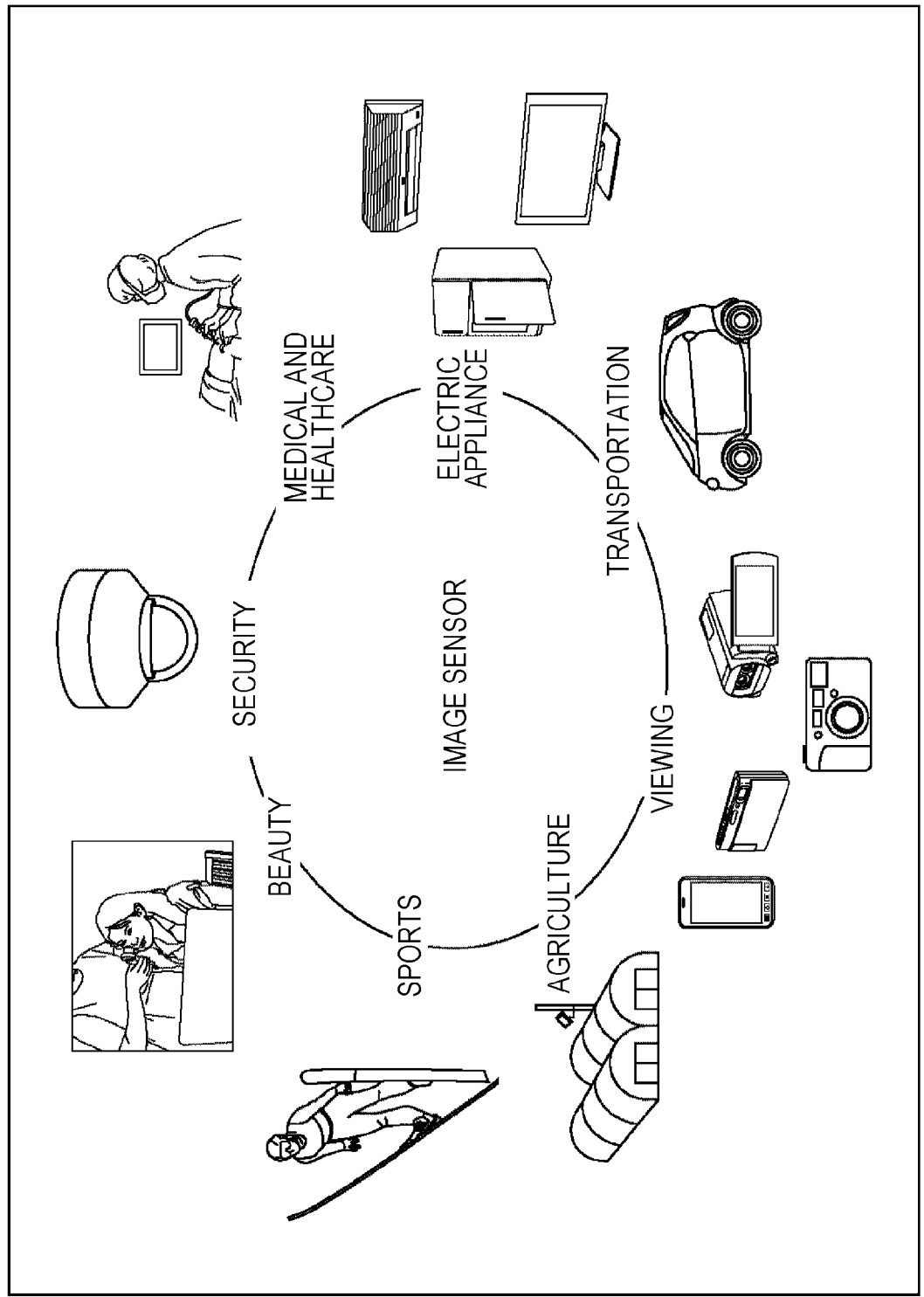
FIG. 28 is a diagram that illustrates an example of a use for using an image sensor.

FIG. 28 is a diagram that illustrates an example of a use for using the image sensor (imaging device) described above.

The image sensor described above, for example, can be used for various cases for sensing light such as visible light, infrared light, ultraviolet light, or an X ray as below.

Apparatus capturing an image provided for viewing such as a digital camera or a mobile apparatus provided with a camera function, or the like Apparatus provided for transportation such as an in-vehicle sensor imaging the front side, the rear side, the periphery, the inside, or the like of a vehicle for safety driving such as vehicle stop, recognition of the state of a driver, or the like, a monitoring camera monitoring a traveling vehicle or a road, a distance measurement sensor that measures a distance between vehicles or the like Apparatus provided for an electric appliance such as a television set, a refrigerator, or an air conditioner for capturing a user's gesture and operating the electric appliance according to the gesture Apparatus provided for a medical or healthcare use such as an endoscope or an apparatus imaging blood vessels by receiving infrared light Apparatus used for security such as a monitoring camera for security or a camera used for person authentication Apparatus used for beauty such as a skin measurement apparatus imaging the skin or a microscope imaging a scalp Apparatus used for sports such as an action camera targeted for sports or a wearable camera Apparatus provided for agriculture such as a camera used for monitoring a field or the state of a crop <Example of Application for Endoscope Operation System>

The technology (present technology) according to an embodiment of the present disclosure can be used for various products. For example, the technology according an embodiment of to the present disclosure may be applied to an endoscope operation system.

Figure 29:
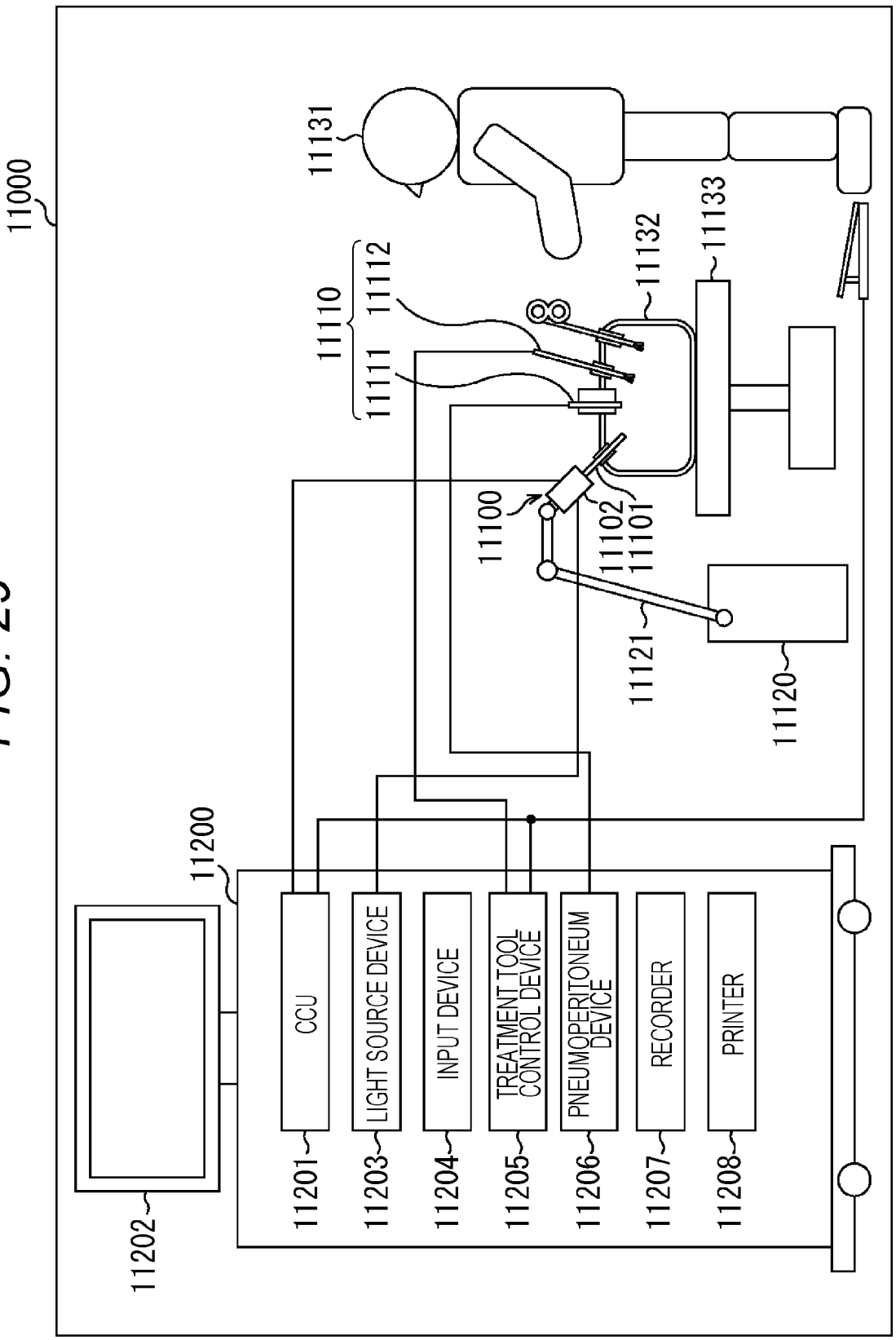
FIG. 29 is a diagram that illustrates an example of a schematic configuration of an endoscope operation system.

FIG. 29 is a diagram that illustrates an example of a schematic configuration of an endoscope operation system according to an embodiment of the technology (present technology) relating to the present disclosure.

FIG. 29 illustrates an appearance in which an operator (doctor) 11131 performs an operation for a patient 11132 positioned on a patient bed 11133 by using the endoscope operation system 11000. As illustrated in the drawing, the endoscope operation system 11000 is configured by an endoscope 11100, other operation tools 11110 such as a pneumoperitoneum tube 11111, an energy treatment tool 11112, and the like, a support arm device 11120 supporting the endoscope 11100, and a cart 11200 in which various devices used for an endoscope operation are mounted.

The endoscope 11100 is configured by a barrel 11101 of which an area of a predetermined length from the tip end is inserted into a body cavity of a patient 11132 and a camera head 11102 connected to the base end of the barrel 11101. In the example illustrated in the drawing, while the endoscope 11100 configured by a so-called hard mirror having the barrel 11101 having hardness is illustrated, the endoscope 11100 may be configured by a so-called soft mirror having a soft barrel.

At the tip end of the barrel 11101, an opening portion into which an objective lens is inserted is formed. A light source device 11203 is connected to the endoscope 11100, light generated by the light source device 11203 is guided up to the tip end of the barrel by using a light guide disposed to extend to the inside of the barrel 11101 and is emitted toward an observation target disposed inside the body cavity of the patient 11132 through the objective lens. Here, the endoscope 11100 may be a direct-viewing mirror or an oblique-viewing mirror, or a side-viewing mirror.

Inside the camera head 11102, an optical system and an imaging device are disposed, and reflection light (observation light) reflected from an observation target is collected in the imaging device by the optical system. A photoelectric conversion of the observation light is performed by the imaging device, and an electrical signal corresponding to the observation light, in other words, an image signal corresponding to an observed image is generated. The image signal is transmitted to a camera control unit (CCU) 11201 as raw data.

The CCU 11201 is configured by a central processing unit (CPU), a graphics processing unit (GPU), or the like and performs overall control of the endoscope 11100 and the display device 11202. In addition, the CCU 11201 receives an image signal from the camera head 11102 and performs various kinds of image processing used for displaying an image based on the image signal such as a developing process (demosaic processing) for the image signal.

The display device 11202 displays an image based on an image signal for which image processing has been performed by the CCU 11201 under the control of the CCU 11201.

The light source device 11203, for example, is configured by a light source such as a light emitting diode (LED) or the like and supplies emission light to the endoscope 11100 when an operating part or the like is imaged.

The input device 11204 is an input interface for the endoscope operation system 11000. A user can input various kinds of information or input an instruction to the endoscope operation system 11000 through the input device 11204. For example, the user inputs an instruction indicating a change in imaging conditions (the kind of emission light, a magnification factor, a focal distance, and the like) of the endoscope 11100 or the like.

The treatment tool control device 11205 controls the driving of the energy treatment tool 11112 used for ablation or incision of a tissue, sealing blood vessels, or the like. The pneumoperitoneum device 11206 transmits gas into the inside of a body cavity through the pneumoperitoneum tube 11111 so as to inflate the body cavity of the patient 11132 for the purpose of the securement of a visual field using the endoscope 11100 and the securement of an operation space of an operator. The recorder 11207 is a device capable of recording various kinds of information relating to an operation. The printer 11208 is a device capable of printing various kinds of information relating to an operation in any one of various forms such as a text, an image, and a graph.

In addition, the light source device 11203 that supplies emission light at the time of causing the endoscope 11100 to image an operation part, for example, may be configured by an LED, a laser light source, or a white light source configured by a combination thereof. In a case where the white light source is configured by a combination of RGB laser light sources, since the output intensity and the output timing of each color (each wavelength) can be controlled with high accuracy, the adjustment of the white balance of a captured image in the light source device 11203 can be performed. In addition, in such a case, images respectively corresponding to RGB can be captured in a time-divisional manner by emitting laser light from the RGB laser light sources to an observation target in a time divisional manner and controlling the driving of the imaging device of the camera head 11102 in synchronization with the emission timing. According to this method, a color image can be acquired without arranging any color filter in the imaging device.

In addition, the driving of the light source device 11203 may be controlled to change the intensity of output light for every predetermined time. By acquiring images in a time divisional manner by controlling the driving of the imaging device of the camera head 11102 in synchronization with the timing of the change of the intensity of light and composing the images, an image with a high dynamic range not having so-called black fullness and halation can be generated.

Furthermore, the light source device 11203 may be configured to supply light of a predetermined wavelength band corresponding to special light observation. In the special light observation, for example, by using wavelength dependency of light absorption in a body tissue, by emitting light of a bandwidth narrower than that of the emission light (in other words, white light) at the time of normal observation, so-called narrow band imaging for imaging a predetermined tissue such as blood vessels of a mucous membrane surface layer with high contrast is performed. Alternatively, in the special light observation, fluorescence observation for acquiring an image using fluorescent light generated by emitting excitation light may be performed. In the fluorescence observation, observation of fluorescent light from a body tissue after emitting excitation light to the body tissue (self-fluorescence observation), acquisition of a fluorescent mage acquired by performing local injection of a reagent such as indocyanine green (ICG) into a body tissue and emitting excitation light corresponding to the florescence wavelength corresponding to the reagent, or the like may be performed. The light source device 11203 may be configured to supply narrow-band light and/or excitation light corresponding to such special light observation.

Figure 30:
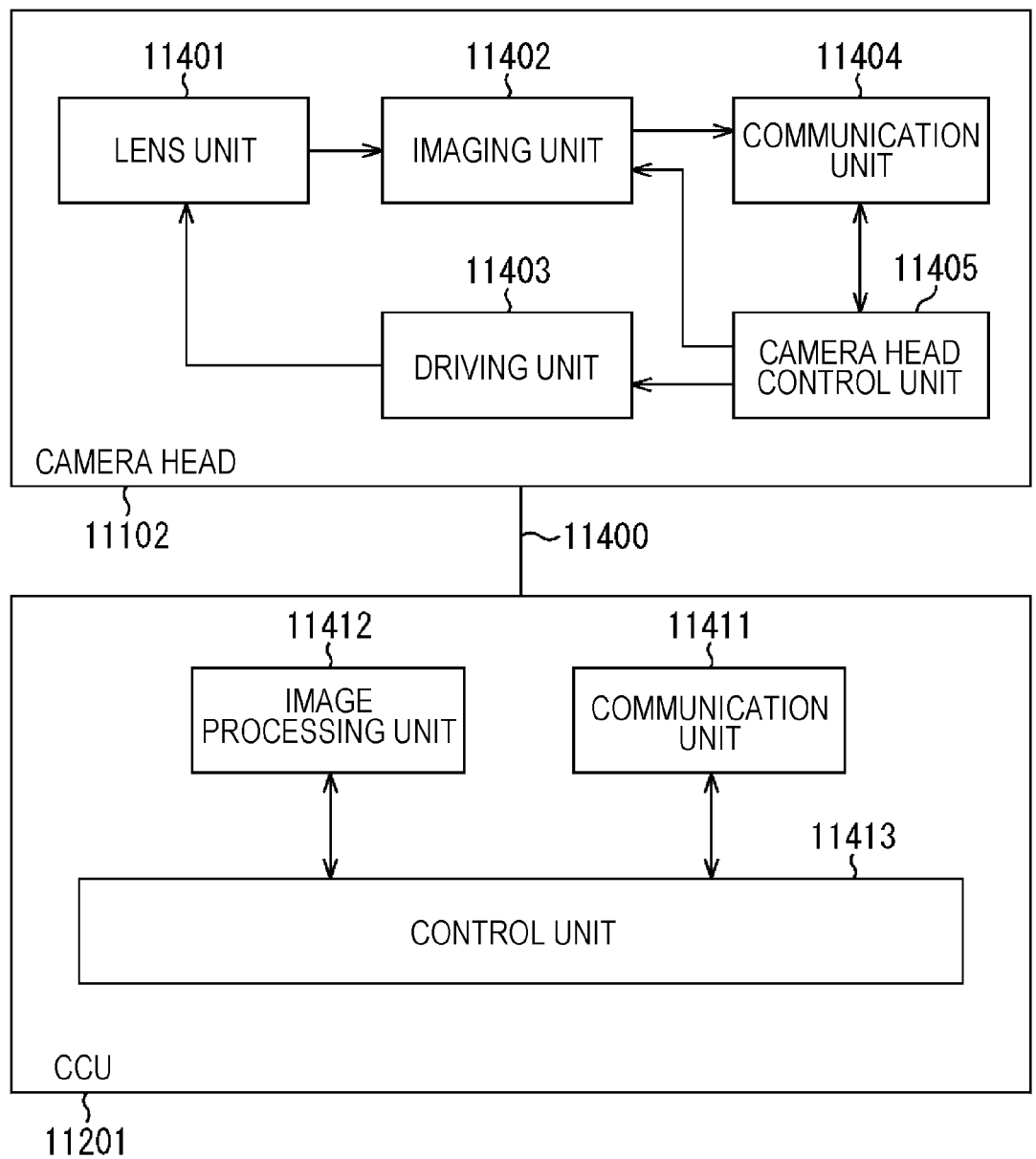
FIG. 30 is a block diagram that illustrates an example of the functional configuration of a camera head and a CCU.

FIG. 30 is a block diagram that illustrates an example of the functional configurations of the camera head 11102 and the CCU 11201 illustrated in FIG. 29.

The camera head 11102 includes a lens unit 11401, an imaging unit 11402, a driving unit 11403, a communication unit 11404, and a camera head control unit 11405. The CCU 11201 includes a communication unit 11411, an image processing unit 11412, and a control unit 11413. The camera head 11102 and the CCU 11201 are connected to be communicable with each other through a transmission cable 11400.

The lens unit 11401 is an optical system disposed in a connection portion for the barrel 11101. Observation light received from the tip end of the barrel 11101 is guided up to the camera head 11102 and is incident to the lens unit 11401. The lens unit 11401 is configured by combining a plurality of lenses including a zoom lens and a focus lens.

The imaging unit 11402 is configured by an imaging device. The number of the imaging devices configuring the imaging unit 11402 may be one (so-called one plate type) or two or more (so-called multi-plate type). In a case where the imaging unit 11402 is configured as a multi-plate type, for example, image signals corresponding to RGB may be generated by the imaging devices, and a color image may be acquired by composing the image signals.

Alternatively, the imaging unit 11402 may be configured to include one imaging device used for acquiring an image signal for each of the right eye and the left eye corresponding to three-dimensional (3D) display. By performing the 3D display, the operator 11131 can perceive the depth of a body tissue in an operation part more accurately. In addition, in a case where the imaging unit 11402 is configured as the multi-plate type, a plurality of systems of lens units 11401 may be disposed in correspondence with imaging devices.

In addition, the imaging unit 11402 may not necessarily be disposed in the camera head 11102. For example, the imaging unit 11402 may be disposed immediately after the objective lens inside the barrel 11101.

The driving unit 11403 is configured by an actuator and moves the zoom lens and the focus lens of the lens unit 11401 along the optical axis by a predetermined distance under the control of the camera head control unit 11405. Accordingly, the magnification factor and the focal point of a captured image acquired by the imaging unit 11402 can be appropriately adjusted.

The communication unit 11404 is configured by a communication device used for transmitting/receiving various kinds of information to/from the CCU 11201. The communication unit 11404 transmits an image signal acquired from the imaging unit 11402 to the CCU 11201 through a transmission cable 11400 as raw data.

In addition, the communication unit 11404 receives a control signal used for controlling the driving of the camera head 11102 from the CCU 11201 and supplies the received control signal to the camera head control unit 11405. In the control signal, for example, information relating to imaging conditions such as information indicating designation of a frame rate of a captured image and information indicating designation of an exposure value at the time of imaging and/or information indicating designation of a magnification factor and a focal point of a captured image is included.

Note that the imaging conditions such as a frame rate, an exposure value, a magnification factor, and a focal point described above may be appropriately designated by a user or be automatically set by the control unit 11413 of the CCU 11201 on the basis of the acquired image signal. In the latter case, so-called an auto exposure (AE) function, an auto focus (AF) function, and an auto white balance (AWB) function are mounted in the endoscope 11100. The camera head control unit 11405 controls the driving of the camera head 11102 on the basis of a control signal supplied from the CCU 11201 that has been received through the communication unit 11404.

The communication unit 11411 is configured by a communication device used for transmitting/receiving various kinds of information to/from the camera head 11102. The communication unit 11411 receives an image signal transmitted from the camera head 11102 through the transmission cable 11400.

In addition, the communication unit 11411 transmits a control signal used for controlling the driving of the camera head 11102 to the camera head 11102. The image signal and the control signal may be transmitted through electric communication, optical communication, or the like.

The image processing unit 11412 performs various kinds of image processing for the image signal that is raw data transmitted from the camera head 11102.

The control unit 11413 performs various kinds of control relating to the imaging of an operation part or the like using the endoscope 11100 and display of a captured image acquired by imaging the operation part or the like. For example, the control unit 11413 generates a control signal used for controlling the driving of the camera head 11102.

In addition, the control unit 11413 displays a captured image in which the operation part or the like is projected on the display device 11202 on the basis of an image signal for which image processing has been performed by the image processing unit 11412. At this time, the control unit 11413 may recognize various objects within the captured image by using various image recognition technologies. For example, the control unit 11413 may recognize an operation tool such as forceps, a specific region of a living body, bleeding, mist at the time of using the energy treatment tool 11112 and the like by detecting the shapes, the colors, and the like of edges of objects included in the captured image. When a captured image is displayed in the display device 11202, the control unit 11413 may superimpose various kinds of operation support information on an image of the operation part by using a result of the recognition. By causing the operation support information to be displayed in a superimposing manner and be presented to the operator 11131, the burden of the operator 11131 can be reduced, or the operator 11131 can process an operation more reliably.

The transmission cable 11400 connecting the camera head 11102 and the CCU 11201 is an electric signal cable corresponding to the communication of an electrical signal, an optical fiber corresponding to optical communication, or a composite cable thereof.

In the example illustrated here, while wired communication using the transmission cable 11400 is performed, the communication between the camera head 11102 and the CCU 11201 may be wirelessly performed. As above, an example of the endoscope operation system according to an embodiment of the technology relating to the present disclosure has been described. The technology relating to the present disclosure, for example, may be applied to the endoscope 11100, the camera head 11102 (the imaging unit 11402 thereof), the CCU 11201 (the image processing unit 11412 thereof), and the like among the configurations described above. Here, while the endoscope operation system has been described as an example, the technology relating to the present disclosure, for example, may be applied to a microscope operation system or the like other than the endoscope operation system.

<Example of Application for Mobile Body>

The technology (present technology) relating to the present disclosure can be applied to various products. For example, the technology relating to the present disclosure may be realized as an apparatus mounted on a mobile body of one of a car, an electric car, a hybrid electric car, an auto bicycle, a bicycle, a personal mobility, an airplane, a Drone, a ship, a robot, and the like.

Figure 31:
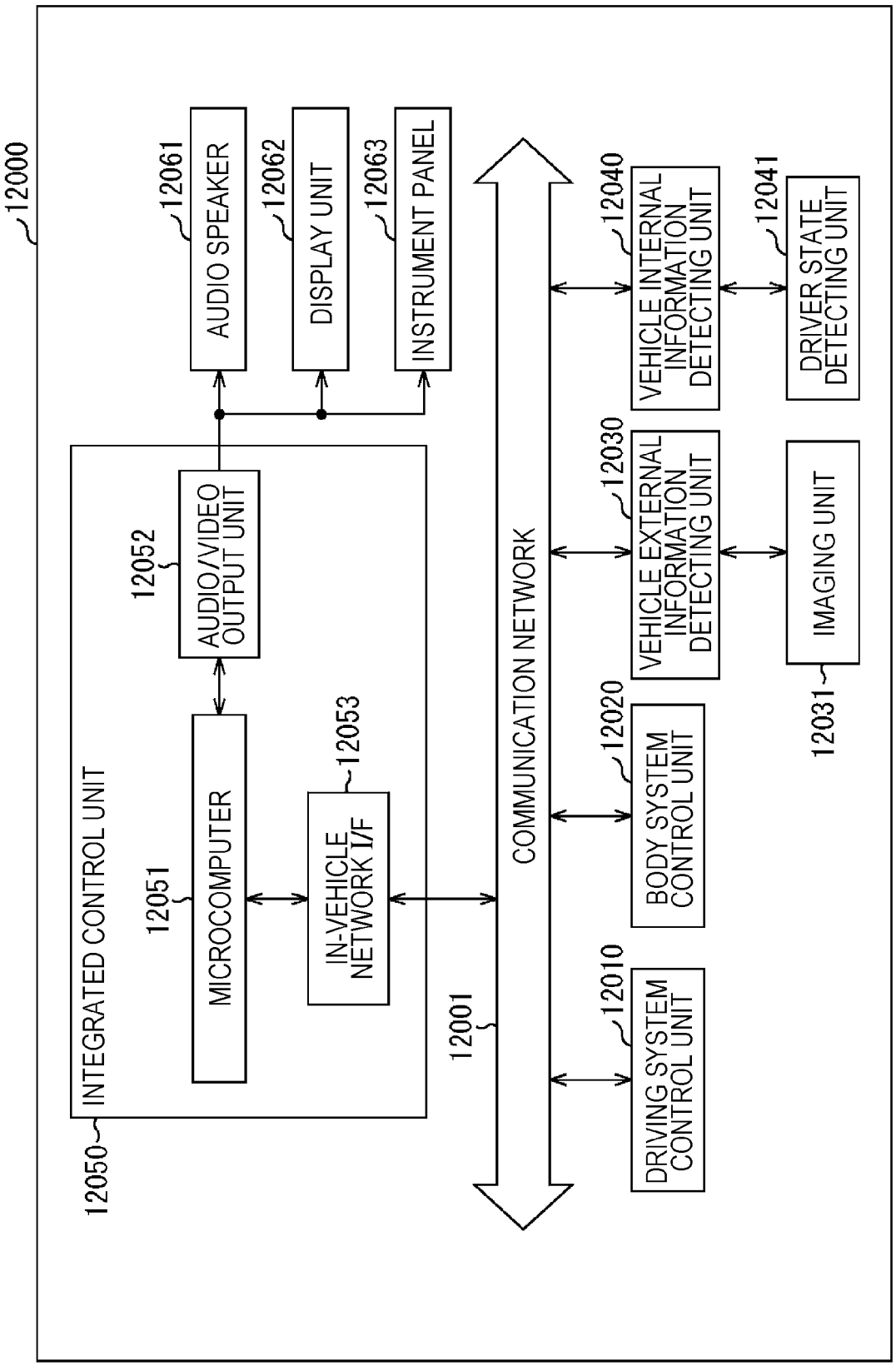
FIG. 31 is a block diagram that illustrates an example of a schematic configuration of a vehicle control system.

FIG. 31 is a block diagram that illustrates an example of a schematic configuration of a vehicle control system that is an example of a mobile body control system according to an embodiment of the technology relating to the present disclosure.

The vehicle control system 12000 includes a plurality of electronic control units connected through a communication network 12001. In the example illustrated in FIG. 31, the vehicle control system 12000 includes a driving system control unit 12010, a body system control unit 12020, a vehicle external information detecting unit 12030, a vehicle internal information detecting unit 12040, and an integrated control unit 12050. In addition, as the functional configurations of the integrated control unit 12050, a microcomputer 12051, an audio/video output unit 12052, and an in-vehicle network interface (I/F) 12053 are illustrated.

The driving system control unit 12010 controls the operations of devices relating to the driving system of the vehicle in accordance with various programs. For example, the driving system control unit 12010 functions as a control device of a driving force generating device used for generating a driving force of a vehicle such as an internal-combustion engine or a driving motor, a driving force delivery mechanism used for delivering a driving force to vehicle wheels, a steering mechanism adjusting the steering angle of the vehicle, a braking device generating a braking force of the vehicle, and the like.

The body system control unit 12020 controls the operations of various devices mounted in a vehicle body in accordance with various programs. For example, the body system control unit 12020 functions as a control device of a keyless entry system, a smart keying system, a power window device, various lamps such as a head lamp, a back lamp, a brake lamp, a blinker, and a fog lamp, or the like. In this case, an electric wave transmitted from a mobile device replacing a key or signals of various switches may be input to the body system control unit 12020. The body system control unit 12020 receives the input of such waves and signals and controls the door lock device, the power window device, the lamps, and the like of the vehicle.

The vehicle external information detecting unit 12030 detects external information of a vehicle on which the vehicle control system 12000 is mounted. For example, the imaging unit 12031 is connected to the vehicle external information detecting unit 12030. The vehicle external information detecting unit 12030 causes the imaging unit 12031 to capture an image of the outside of the vehicle and receives the captured image. The vehicle external information detecting unit 12030 may perform an object detecting process for a person, a car, an obstacle, a sign or a character on the road or a distance detecting process on the basis of the received image.

The imaging unit 12031 is an optical sensor that receives light and outputs an electrical signal according to the amount of received light. The imaging unit 12031 can output an electric signal as an image or as information of a measured distance. In addition, the light received by the imaging unit 12031 may be visible light or non-visible light such as infrared light.

The vehicle internal information detecting unit 12040 detects information of the inside of the vehicle. For example, a driver state detecting unit 12041 detecting the state of a driver is connected to the vehicle internal information detecting unit 12040. For example, the driver state detecting unit 12041 may include a camera that images a driver, and the vehicle internal information detecting unit 12040, on the basis of detection information input from the driver state detecting unit 12041, may calculate the degree of fatigue or the degree of concentration of a driver or may determine whether a driver is napping in the seat.

The microcomputer 12051 can calculate a control target value of the driving force generating device, the steering mechanism, or the braking device on the basis of the vehicle internal/external information acquired by the vehicle external information detecting unit 12030 or the vehicle internal information detecting unit 12040 and output a control instruction to the driving system control unit 12010. For example, the microcomputer 12051 can perform cooperative control for the purpose of realization of the function of an advanced driver assistance system (ADAS) including collision avoidance or shock alleviation of a vehicle, following running based on an inter-vehicle distance, vehicle speed maintaining running, a vehicle collision warning, a vehicle lane departure warning, and the like.

In addition, the microcomputer 12051 can perform cooperative control for the purpose of automatic driving for autonomously running without depending on the operation of a driver or the like by controlling the driving force generating device, the steering mechanism, the braking device, or the like on the basis of information of the periphery of the vehicle acquired by the vehicle external information detecting unit 12030 or the vehicle internal information detecting unit 12040.

In addition, the microcomputer 12051 can output a control instruction to the body system control unit 12020 on the basis of the information of the outside of the vehicle acquired by the vehicle external information detecting unit 12030. For example, the microcomputer 12051 can perform cooperative control for the purpose of achieving antiglare such as switching a high beam to a low beam by controlling a head lamp in accordance with the position of a preceding car or an oncoming car detected by the vehicle external information detecting unit 12030 or the like.

The audio/video output unit 12052 transmits an output signal of at least one of an audio and a video to an output device capable of visually or acoustically notifying passenger of the vehicle or the outside of the vehicle of information. In the example illustrated in FIG. 31, an audio speaker 12061, a display unit 12062, and an instrument panel 12063 are illustrated as examples of the output device. The display unit 12062, for example, may include at least one of an onboard display and a head-up display.

Figure 32:
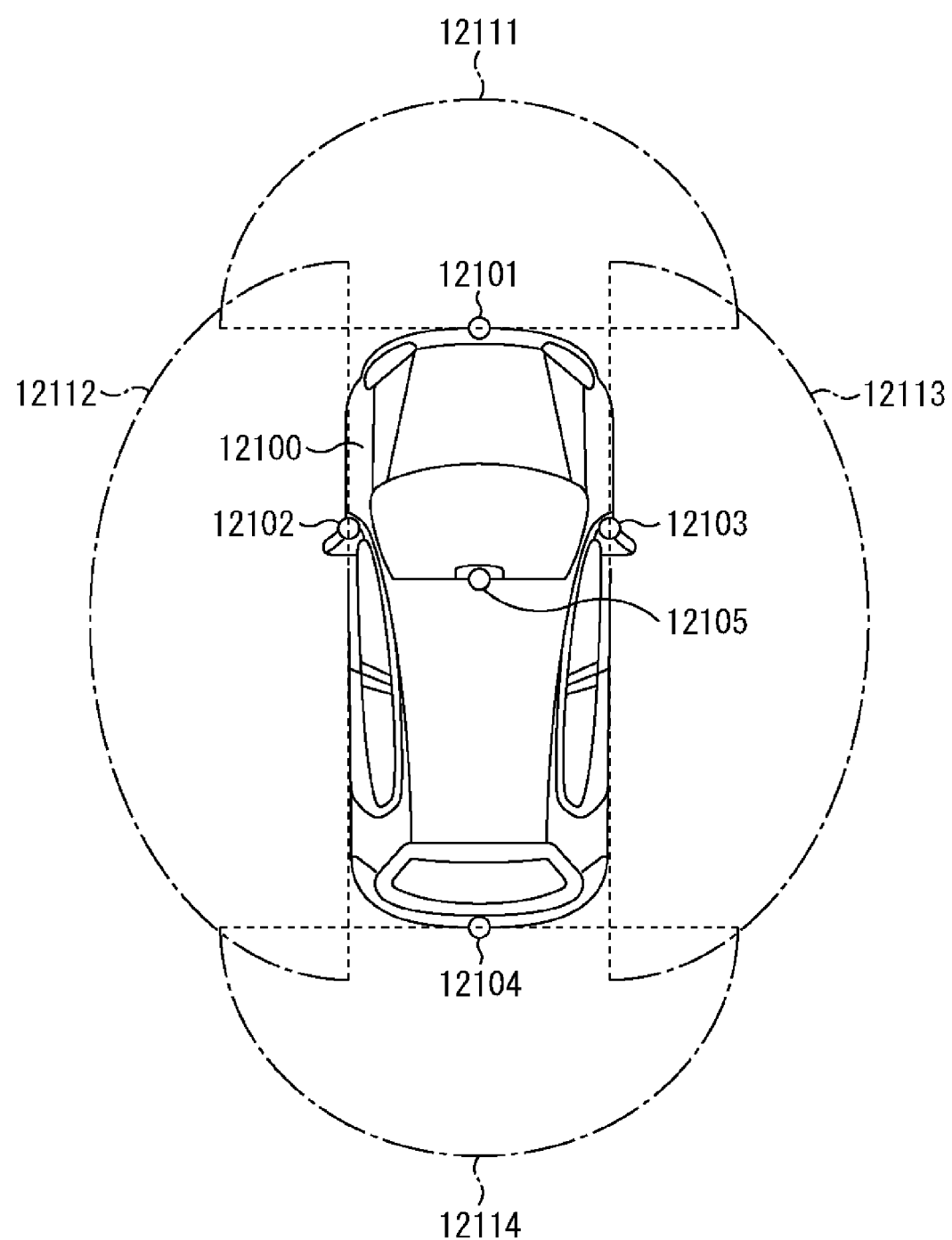
FIG. 32 is an explanatory diagram that illustrates an example of installation positions of a vehicle external information detecting unit and an imaging unit.

FIG. 32 is a diagram that illustrates an example of the installation position of the imaging unit 12031.

As illustrated in FIG. 32, a vehicle 12100 includes imaging units 12101, 12102, 12103, 12104, and 12105 as the imaging unit 12031.

The imaging units 12101, 12102, 12103, 12104, and 12105, for example, are installed at positions such that the front nose, the side mirror, the rear bumper, and the back door of the vehicle 12100, and an upper part of front glass inside the vehicle cabin, and the like. The imaging unit 12101 provided at the front nose and the imaging unit 12105 provided at the upper part of the front glass inside the vehicle cabin mainly acquire images of the front side of the vehicle 12100. The imaging units 12102 and 12103 provided at the side mirrors mainly acquire images of the sides of the vehicle 12100. The imaging unit 12104 provided at the rear bumper or the back door mainly acquires images of the rear sides of the vehicle 12100. The images of the front sides acquired by the imaging units 12101 and 12105 are mainly used for detection of a preceding vehicle, a pedestrian, an obstacle, a traffic lamp, a traffic sign, a vehicle lane, and the like.

Note that FIG. 32 illustrates an example of the imaging ranges of the imaging units 12101 to 12104. The imaging range 12111 illustrates an imaging range of the imaging unit 12101 installed at the front nose, the imaging ranges 12112 and 12113 respectively illustrate the imaging ranges of the imaging units 12102 and 12103 installed at the side mirrors, and the imaging range 12114 illustrates the imaging range of the imaging unit 12104 installed at the rear bumper or the back door. For example, by superimposing image data imaged by the imaging units 12101 to 12104, a bird's eye view image acquired by viewing the vehicle 12100 from the upper side is acquired.

At least one of the imaging units 12101 to 12104 may have a function for acquiring distance information. For example, at least one of the imaging units 12101 to 12104 may be a stereo camera formed by a plurality of imaging devices or an imaging device including a pixel used for detecting a phase difference.

For example, the microcomputer 12051 can extract a solid object that is the closest solid object present on a traveling road of the vehicle 12100 and travels at a predetermined speed (for example, 0 km/h or more) in an approximately same direction as that of the vehicle 12100 as a preceding car by acquiring a distance up to each solid object in the imaging ranges 12111 to 12114 and a change (a relative speed with respect to the vehicle 12100) of the distance with respect to time on the basis of distance information acquired from the imaging units 12101 to 12104. In addition, the microcomputer 12051 may set an inter-vehicle distance to be secured before a preceding car in advance and perform automatic brake control (including following stop control), automatic acceleration control (including following start control), and the like. In this way, cooperative control for the purpose of automatic driving for autonomous traveling without depending on an operation of the driver and the like can be performed.

For example, the microcomputer 12051 can classify solid object data relating to solid objects into two-wheel vehicles, ordinary vehicles, large-size vehicles, pedestrians, electric poles, and the other solid objects and extracts the solid objects on the basis of the distance information acquired by the imaging units 12101 to 12104 and use the extracted solid objects for automatic avoidance of obstacle objects. For example, the microcomputer 12051 classifies obstacles present on the periphery of the vehicle 12100 as obstacles that can be visually recognized by the driver of the vehicle 12100 and obstacles that are difficult to visually recognize for the driver. Then, the microcomputer 12051 can determine a collision risk representing the degree of risk for a collision with each obstacle and, when a situation in which the collision risk has a collision possibility higher than a set value is formed, outputs a warning signal to the driver through the audio speaker 12061 or the display unit 12062 and performs forced deceleration or avoidance steering through the driving system control unit 12010, thereby performing driving support for avoiding collisions.

At least one of the imaging units 12101 to 12104 may be an infrared camera detecting infrared light. For example, the microcomputer 12051 can recognize a pedestrian by determining whether or not a pedestrian is present in captured images acquired by the imaging units 12101 to 12104. The recognition of a pedestrian, for example, may be performed by a sequence in which feature points in the captured images acquired by the imaging units 12101 to 12104 as infrared cameras are extracted and a sequence in which it is determined whether or not an object is a pedestrian by performing a pattern matching process for a series of feature points representing the contour of the object. When the microcomputer 12051 determines that a pedestrian is present in the captured images acquired by the imaging units 12101 to 12104 and recognizes the pedestrian, the audio/video output unit 12052 performs control of the display unit 12062 to display a rectangular contour used for an emphasis to be superimposed on the recognized pedestrian. In addition, the audio/video output unit 12052 may perform control of the display unit 12062 such that an icon or the like representing the pedestrian is displayed at a desired position.

As above, an example of the vehicle control system according to an embodiment of the technology relating to the present disclosure has been described. The technology relating to the present disclosure can be applied to the imaging unit 12031 or the like among the configurations described above.

<Example of Combination of Configurations>

In addition, the present technology can take the following configurations as well.

(1)

A sensor chip including:

a pixel array unit that has a rectangular-shaped area in which a plurality of sensor elements are arranged in an array pattern; and a global control circuit, in which driving elements simultaneously driving the sensor elements are arranged in one direction, and each of the driving elements is connected to a control line disposed for each one column of the sensor elements, that is arranged to have a longitudinal direction to be along a long side of the pixel array unit.

(2)

The sensor chip according to (1), in which two global control circuits are arranged on both sides of the pixel array unit along a longitudinal direction of the pixel array unit, and the driving elements of each of the global control circuits are connected to both ends of the control line.

(3)

The sensor chip according to (2), in which the signal line arranged for each one column of the sensor elements is divided at approximate center of the pixel array unit, and among the driving elements of the two global control circuits arranged on both sides of the pixel array unit, the driving elements of one side are connected to the divided signal line of one side, and the driving elements of the other side are connected to the divided signal line of the other side.

(4)

The sensor chip according to any of (1) to (3), in which the sensor chip has a stacking structure in which a sensor substrate in which the pixel array unit is arranged and a logic substrate in which the global control circuit is arranged are stacked.

(5)

The sensor chip according to any of (1) to (4), in which the driving elements arranged in the global control circuit of the logic substrate are connected to a one end portion of the signal line through a connection portion disposed on a periphery of an area in which the pixel array unit is arranged in the sensor substrate.

(6)

The sensor chip according to any of (1) to (4), in which two global control circuits are arranged in the logic substrate in correspondence with both sides of the pixel array unit along a longitudinal direction of the pixel array unit, and the driving elements arranged in the two global control circuits arranged in the logic substrate are connected to both end portions of the signal line through connection portions disposed on both sides, facing each other, on the periphery of the area in which the pixel array unit is arranged in the sensor substrate.

(7)

The sensor chip according to any of (1) to (4), in which a signal line arranged for each one column of the sensor elements is divided at approximate center of the pixel array unit, and among the driving elements of the two global control circuits arranged in the logic substrate in correspondence with both sides of the pixel array unit respectively, the driving elements of one side are connected to the divided signal line of one side, and the driving elements of the other side are connected to the divided signal line of the other side.

(8)

The sensor chip according to any of (1) to (4), in which the global control circuit is arranged at approximate center of the logic substrate, and the driving elements arranged in the global control circuit of the logic substrate are connected to approximate center of the signal line through a connection portion disposed to overlap the pixel array unit in a plan view.

(9)

The sensor chip according to any of (1) to (4), in which a signal line arranged for each one column of the sensor elements is divided at approximate center of the pixel array unit, and two driving elements are arranged for each one column of the sensor elements in the global control circuit, the driving elements of one side are connected to an end portion of a center side of the pixel array unit of the signal line of one side, and the driving elements of the other side are connected to an end portion of the center side of the pixel array unit of the signal line of the other side.

(10)

The sensor chip according to any of (1) to (4), in which the two global control circuits are arranged in the logic substrate, the driving elements of one of the global control circuits are connected to center of one half portion of the signal line of one side, and the driving elements of the other of the global control circuits are connected to center of one half portion of the signal line of the other side.

(11)

The sensor chip according to any of (1) to (4), in which the signal line arranged for each one column of the sensor elements is divided at approximate center of the pixel array unit, and the two global control circuits are arranged in the logic substrate, the driving elements of one of the global control circuits are connected to center of the signal line of one side, and the driving elements of the other global control circuit are connected to center of the signal line of the other side.

(12)

The sensor chip according to (11), in which the signal line is divided into three or more signal lines, and the driving elements of corresponding three or more global control circuits are connected at approximate center of the signal lines.

(13)

The sensor chip according to any of (1) to (12), in which the signal line is divided into a plurality of parts, at least one global control circuit is arranged in the logic substrate, and a plurality of buffer circuits corresponding to the division number of the signal line are arranged.

(14)

The sensor chip according to any of (1) to (12), in which the sensor chip is configured by stacking three or more semiconductor substrates.

(15)

An electronic apparatus including a sensor chip including: a pixel array unit that has a rectangular-shaped area in which a plurality of sensor elements are arranged in an array pattern; and a global control circuit, in which driving elements simultaneously driving the sensor elements are arranged in one direction, and each of the driving elements is connected to a control line disposed for each one column of the sensor elements, that is arranged to have a longitudinal direction to be along a long side of the pixel array unit.

Note that an embodiment is not limited to the embodiments described above, but various changes can be made in a range not departing from the concept of the present disclosure. In addition, effects described here are merely examples, and the effect is not limited thereto, and thus, any other effect may be acquired.

It should be understood by those skilled in the art that various modifications, combinations, sub-combinations and alterations may occur depending on design requirements and other factors insofar as they are within the scope of the appended claims or the equivalents thereof.

REFERENCE SIGNS LIST

11 Sensor chip
12 Pixel array unit
13 Global control circuit
14 Rolling control circuit
15 Column ADC
16 Input/output unit
17 Logic circuit
21 Control line
31 Internal buffer
32 Driving element
41 and 42 Internal buffer
43 Register
44 Driving element
45 Decoder
46 AND gate
51 Sensor substrate
52 Logic substrate
53 and 54 TSV area
55 Buffer circuit
61 Memory

The invention claimed is:

1. A time of flight sensor comprising:
a pixel array including a plurality of pixels arranged in rows and columns;
a global control circuit disposed along a first side of the pixel array and configured to output a global control signal to the plurality of pixels, the global control circuit comprising a clock tree structure that includes
a plurality of buffer circuits, and
a plurality of driving circuits;
a rolling control circuit disposed along a second side of the pixel array and configured to output a rolling control signal to the plurality of pixels; and
a column circuit coupled to the plurality of pixels, the column circuit including a plurality of analog-to-digital converters.

2. The time of flight sensor according to claim 1, wherein the plurality of buffer circuits includes a first buffer circuit.

3. The time of flight sensor according to claim 2, wherein the plurality of driving circuits includes a first driving circuit and a second driving circuit.

4. The time of flight sensor according to claim 3, wherein the first buffer circuit is coupled to the first driving circuit and the second driving circuit serially.

5. The time of flight sensor according to claim 3, wherein an output of the first buffer circuit is coupled to an input of the first driving circuit and an input of the second driving circuit.

6. The time of flight sensor according to claim 5, wherein the output of the first buffer circuit is coupled to an input of the second buffer circuit and an input of the third buffer circuit.

7. The time of flight sensor according to claim 6, wherein an output of the second buffer circuit is coupled to the input of the first driving circuit and the input of the second driving circuit.

8. The time of flight sensor according to claim 7, wherein an output of the third buffer circuit is coupled to the input of the first driving circuit and the input of the second driving circuit.

9. The time of flight sensor according to claim 3, wherein the plurality of buffer circuits includes a second buffer circuit and a third buffer circuit.

10. The time of flight sensor according to claim 1, wherein the global control circuit transfers the global control signal through the plurality of buffer circuits and the plurality of driving circuits.

11. A time of flight sensor comprising:
a pixel array including a plurality of pixels arranged in rows and columns;
a first control circuit disposed along a first side of the pixel array and configured to output a first control signal to the plurality of pixels, the first control circuit comprising a clock tree structure that includes
a plurality of buffer circuits, and
a plurality of driving circuits;
a second control circuit disposed along a second side of the pixel array and configured to output a second control signal to the plurality of pixels; and
a column circuit coupled to the plurality of pixels, the column circuit including a plurality of analog-to-digital converters.

12. The time of flight sensor according to claim 11, wherein the plurality of buffer circuits includes a first buffer circuit.

13. The time of flight sensor according to claim 12, wherein the plurality of driving circuits includes a first driving circuit and a second driving circuit.

14. The time of flight sensor according to claim 13, wherein the first buffer circuit is coupled to the first driving circuit and the second driving circuit serially.

15. The time of flight sensor according to claim 13, wherein an output of the first buffer circuit is coupled to an input of the first driving circuit and an input of the second driving circuit.

16. The time of flight sensor according to claim 15, wherein the output of the first buffer circuit is coupled to an input of the second buffer circuit and an input of the third buffer circuit.

17. The time of flight sensor according to claim 16, wherein an output of the second buffer circuit is coupled to the input of the first driving circuit and the input of the second driving circuit.

18. The time of flight sensor according to claim 17, wherein an output of the third buffer circuit is coupled to the input of the first driving circuit and the input of the second driving circuit.

19. The time of flight sensor according to claim 13, wherein the plurality of buffer circuits includes a second buffer circuit and a third buffer circuit.

20. The time of flight sensor according to claim 11, wherein the first control circuit transfers the first control signal through the plurality of buffer circuits and the plurality of driving circuits.

21. A time of flight sensor comprising:
a pixel array including a plurality of pixels arranged in rows and columns;
a first control circuit configured to output a first control signal to the plurality of pixels, the first control circuit comprising a clock tree structure that includes
a plurality of buffer circuits, and
a plurality of driving circuits;
a second control circuit configured to output a second control signal to the plurality of pixels; and
a column circuit coupled to the plurality of pixels, the column circuit including a plurality of analog-to-digital converters.

22. The time of flight sensor according to claim 21, wherein the plurality of buffer circuits includes a first buffer circuit.

23. The time of flight sensor according to claim 22, wherein the plurality of driving circuits includes a first driving circuit and a second driving circuit.

24. The time of flight sensor according to claim 23, wherein the first buffer circuit is coupled to the first driving circuit and the second driving circuit serially.

25. The time of flight sensor according to claim 23, wherein an output of the first buffer circuit is coupled to an input of the first driving circuit and an input of the second driving circuit.

26. The time of flight sensor according to claim 25, wherein the output of the first buffer circuit is coupled to an input of the second buffer circuit and an input of the third buffer circuit.

27. The time of flight sensor according to claim 26, wherein an output of the second buffer circuit is coupled to the input of the first driving circuit and the input of the second driving circuit.

28. The time of flight sensor according to claim 27, wherein an output of the third buffer circuit is coupled to the input of the first driving circuit and the input of the second driving circuit.

29. The time of flight sensor according to claim 23, wherein the plurality of buffer circuits includes a second buffer circuit and a third buffer circuit.

30. The time of flight sensor according to claim 21, wherein the first control circuit transfers the first control signal through the plurality of buffer circuits and the plurality of driving circuits.

* * * * *